US008216391B2

(12) United States Patent
Mokuo

(10) Patent No.: US 8,216,391 B2
(45) Date of Patent: Jul. 10, 2012

(54) SUBSTRATE PROCESSING APPARATUS AND SUBSTRATE PROCESSING METHOD

(75) Inventor: Shori Mokuo, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1096 days.

(21) Appl. No.: 12/073,364

(22) Filed: Mar. 4, 2008

(65) Prior Publication Data

US 2008/0223411 A1 Sep. 18, 2008

(30) Foreign Application Priority Data

Mar. 7, 2007 (JP) ................................ 2007-057546

(51) Int. Cl.
*B08B 7/00* (2006.01)
*B08B 7/04* (2006.01)
*B08B 3/00* (2006.01)

(52) U.S. Cl. .................. 134/56 R; 134/57 R; 134/58 R; 134/61; 134/64 R; 134/133; 134/137; 134/142; 134/18; 134/32; 134/902

(58) Field of Classification Search .................. 134/902, 134/18, 26, 25.1, 1.1, 1.3, 56 R, 57 R, 58 R, 134/61, 64 R, 122 R, 133, 137, 182, 32, 33, 134/142
See application file for complete search history.

(56) References Cited

U.S. PATENT DOCUMENTS

| | | | | |
|---|---|---|---|---|
| 5,442,828 A | * | 8/1995 | Lutz | 15/88.3 |
| 5,762,084 A | * | 6/1998 | Krusell et al. | 134/184 |
| 6,553,792 B1 | * | 4/2003 | Amari et al. | 68/147 |
| 6,575,178 B1 | * | 6/2003 | Kamikawa | 134/88 |
| 6,637,446 B2 | * | 10/2003 | Frost et al. | 134/184 |
| 6,772,029 B2 | * | 8/2004 | Kobayashi et al. | 700/100 |
| 7,392,812 B2 | * | 7/2008 | Ohshimo et al. | 134/56 R |
| 2004/0129300 A1 | * | 7/2004 | Ohshimo et al. | 134/61 |
| 2006/0118140 A1 | * | 6/2006 | Nishimura et al. | 134/34 |

FOREIGN PATENT DOCUMENTS

| | | |
|---|---|---|
| JP | 5-50018 | 3/1993 |
| JP | 11-40535 | 2/1999 |
| JP | 11-319732 | 11/1999 |
| JP | 2001-518704 | 10/2001 |
| JP | 2006-261548 | 9/2006 |

OTHER PUBLICATIONS

Japanese Office Action issued on Aug. 12, 2011 for Application No. 2007-057546 with English translation.

* cited by examiner

*Primary Examiner* — Alexander Markoff
(74) *Attorney, Agent, or Firm* — Smith, Gambrell & Russell, LLP

(57) ABSTRACT

A substrate processing apparatus of a simplified structure, which is capable of decreasing an amount of a process liquid to be used, and of restraining change in temperature of the process liquid is provided. The substrate processing apparatus includes: a processing unit that holds one substrate and processes the substrate held by the processing unit; a processing bath capable of simultaneously accommodating a plurality of substrates, the processing bath storing a process liquid into which a substrate is immersed so as to be processed, the process liquid being circulatingly supplied to the processing bath; and a transfer unit that simultaneously transfers substrates whose number is less than the number of substrate that can be accommodated in the processing bath. The transfer unit transfers, at least, to the processing bath in which the process liquid is stored. A substrate is processed with the use of at least one of the processing unit and the processing bath.

14 Claims, 8 Drawing Sheets

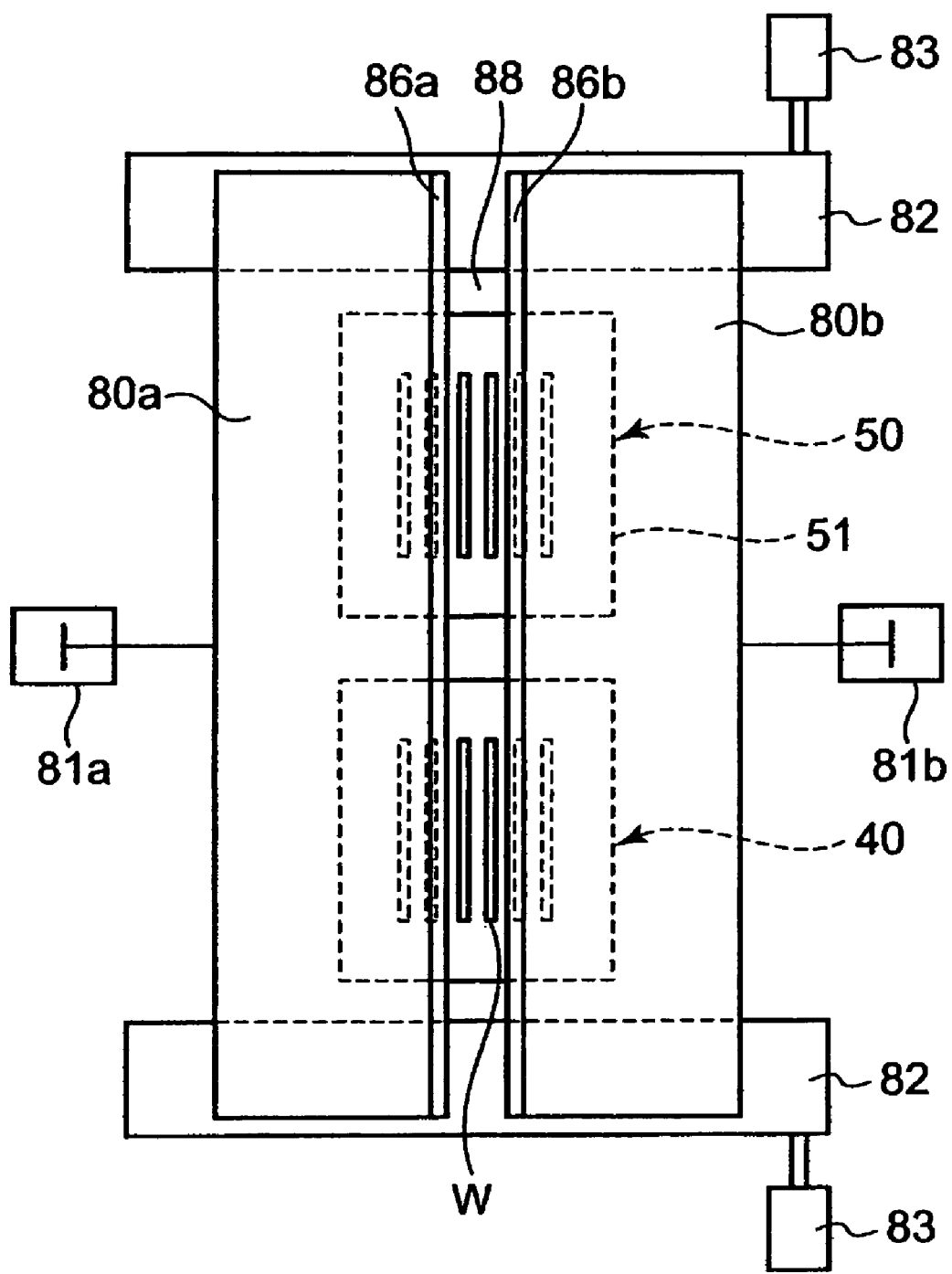
F I G. 5

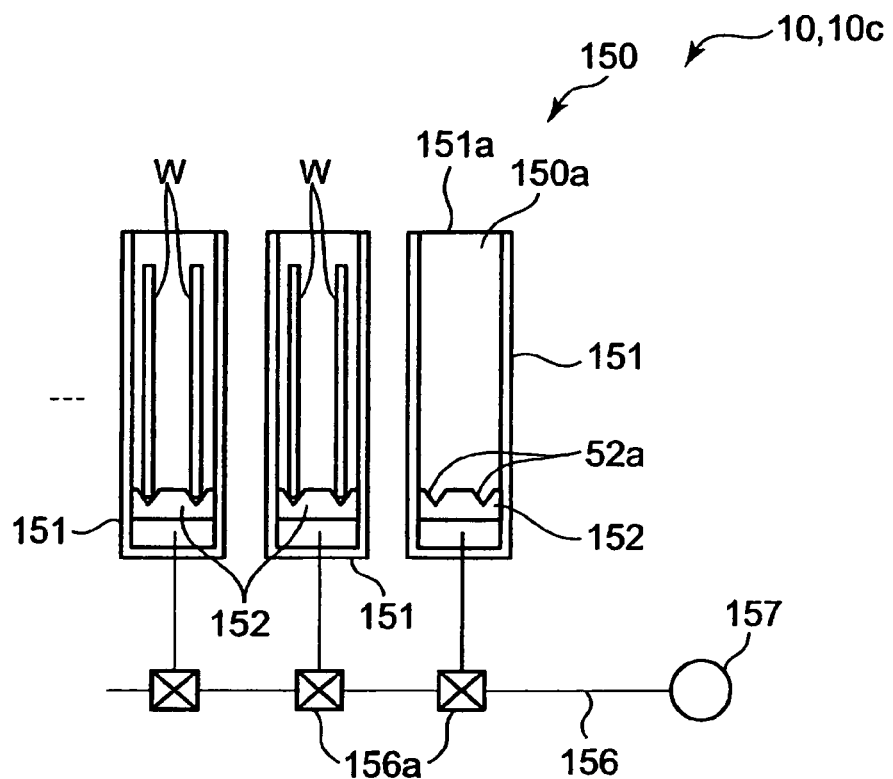
F I G. 1 2
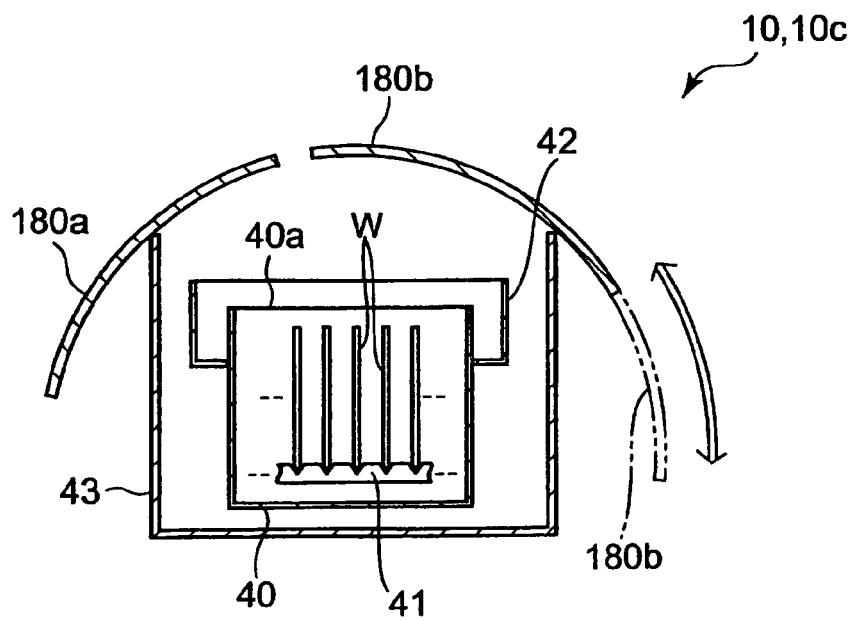
F I G. 1 3

SUBSTRATE PROCESSING APPARATUS AND SUBSTRATE PROCESSING METHOD

CROSS REFERENCE TO RELATED APPLICATIONS

This application is based upon and claims the benefit of priority from the prior Japanese Patent Application No. 2007-57546 filed on Mar. 7, 2007, the entire contents of which are incorporated herein by reference.

BACKGROUND OF THE INVENTION

1. Field of the Invention

The present invention relates to a substrate processing apparatus for processing a substrate with the use of a process liquid. Particularly, it pertains to a substrate processing apparatus of a simplified structure, which is capable of decreasing an amount of a process liquid to be used, and of restraining change in temperature of the process liquid.

In addition, the present invention relates to a substrate processing method for processing a substrate with the use of a process liquid. Particularly, it pertains to a substrate processing method which is capable of decreasing an amount of a process liquid to be used, and of restraining change in temperature of the process liquid.

2. Description of Related Art

There has been conventionally known a substrate processing apparatus including a processing unit that holds one substrate and processes the substrate held by the processing unit, namely, a so-called single-wafer processing unit (e.g., JP11-319732A). In general, a plurality of processing units are incorporated in the substrate processing apparatus, so that substrates can be concurrently processed in the respective processing units.

One substrate held in the single-wafer processing unit is generally processed by supplying a process liquid thereto while the substrate is being rotated. According to such a single-wafer processing unit, one substrate can be uniformly processed by supplying a process liquid onto a surface of the substrate. In order to subject a substrate to various processes using various process liquids, two or more kinds of process liquids can be supplied to the processing unit. A process liquid, which has been used for processing a substrate in the processing unit, is collected for the sake of economy. The collected process liquid is again supplied into the processing unit through a collecting line, and the process liquid is used for processing the same or another substrate.

Generally, when a process liquid (more specifically, chemical liquid) has a higher temperature, reaction by the process liquid is activated so that processing of a substrate is accelerated. Thus, a process liquid, which has been heated and held at a high temperature, is sometimes used for processing a substrate. In addition, the collecting line is equipped with a heater or the like, in order that the temperature of the process liquid to be recycled is maintained to be constant.

However, when a substrate is processed in the single-wafer processing unit, it is impossible to completely prevent change in temperature of the process liquid throughout the process. For example, a temperature of the process liquid, which has been spun off at a high speed from the substrate that is being rotated, is lowered. Further, when a process is started, heat of the supplied process liquid of a high temperature is likely to be absorbed by respective parts of the processing unit. A supplying system and a collecting system of a process liquid are common to the plurality of processing units. Thus, after a process of a substrate is started in a certain processing unit, for example, lowering of temperature of the process liquid that is collected from the processing unit invites change in temperature of the process liquid which is to be supplied to another processing unit.

Furthermore, when a process liquid is supplied onto a substrate, the process liquid is spun off at a high speed from the substrate that is being rotated, and is dispersed in the processing unit. In addition, when a different kind of process liquid is supplied into each processing unit, some of the process liquid should be discarded in order to prevent the process liquids of different kinds from being mixed and supplied onto a substrate. Thus, it is impossible to collect all the process liquid that has been supplied into the processing unit.

Furthermore, in addition to a supply line for supplying a process liquid and the above-described collecting line, the processing unit includes a discarding line for discarding a process liquid from the processing unit, and an evacuating line for evacuating an atmosphere in the processing unit. In accordance with the kinds of process liquids to be used, some of the supply line, the collecting line, the discarding line, and the evacuating line have to be separately provided for each kind of the process liquid. Furthermore, these respective lines are connected to each other between the plurality of processing units. As a result, in the substrate processing apparatus including the plurality of single-wafer processing units, a structure of the pipe arrangement is significantly complicated, and thus control of the substrate processing apparatus is significantly complicated.

SUMMARY OF THE INVENTION

In view of these circumstances, the present invention has been made by improving a substrate processing apparatus including at least one or more single-wafer processing units. The object of the present invention is to provide a substrate processing apparatus of a simplified structure, which is capable of decreasing an amount of a process liquid to be used, and of restraining change in temperature of the process liquid.

In view of these circumstances, the present invention has been made by improving a substrate processing apparatus including at least one or more single-wafer processing units. The object of the present invention is to provide a substrate processing method that is capable of decreasing an amount of a process liquid to be used, and of restraining change in temperature of the process liquid.

The substrate processing apparatus of the present invention comprises: a processing unit that holds one substrate and processes the substrate held by the processing unit; a processing bath capable of simultaneously accommodating a plurality of substrates, the processing bath storing a process liquid into which a substrate is immersed so as to be processed, the process liquid being circulatingly supplied to the processing bath; and a transfer unit that simultaneously transfers, at least to the processing bath, one or more substrates whose number is less than the number of substrates that can be simultaneously accommodated in the processing bath; wherein the substrate processing apparatus processes one or more substrates with the use of at least one of the processing unit and the processing bath.

According to the substrate processing apparatus of the present invention, a process using a certain process liquid can be performed in the processing bath, and a process using another process liquid can be performed in the processing unit. Thus, the number of the kinds of process liquids used in the processing unit can be reduced, while an overall structure of the substrate processing apparatus and control of the substrate processing apparatus can be simplified. In addition, when a substrate is processed in the processing bath, an amount of a process liquid to be used can be decreased by recycling the process liquid. Further, when a substrate is processed in the processing bath, a temperature of a heated process liquid in the processing bath can be maintained within a certain temperature range, so that change in temperature of the process liquid of a high temperature can be remarkably restrained. The substrate processing apparatus may further comprise a control device that judges whether a substrate to be processed that has been brought into the processing apparatus is firstly transferred to the processing unit or the processing bath.

The substrate processing apparatus of the present invention may further comprise a control device that regulates a substrate processing period in the processing bath, for every one or more substrates that have been simultaneously transferred by the transfer unit to the processing bath. According to such a substrate processing apparatus, by sequentially loading substrates into the processing bath, a number of substrates can be concurrently processed. Thus, the substrates can be efficiently processed.

In the substrate processing apparatus of the present invention, the control device may measure an elapsed substrate processing period of every one or more substrates that have been simultaneously transferred by the transfer unit to the processing bath, and may control the transfer unit in such a manner that, when the elapsed substrate processing period reaches a preset processing period, the one or more substrates are unloaded from the processing bath. According to this substrate processing apparatus, processing periods of the respective substrates to be concurrently processed can be made uniform. Thus, non-uniformity in processing of the respective substrates can be sufficiently restrained, whereby the substrates can be stably processed.

In addition, in the substrate processing apparatus of the present invention, the transfer unit may be configured to receive a substrate that have been processed in the processing bath, and to transfer the substrate to the processing unit. According to this substrate processing apparatus, a structure of the substrate processing apparatus and control thereof can be simplified, as compared with a case in which there are separately disposed a transfer unit for transferring a substrate between the processing bath and the processing unit, and a transfer unit for transferring a substrate, that has been brought into the substrate processing apparatus, to the processing bath. Further, manufacturing costs and maintaining costs of the substrate processing apparatus can be reduced, and thus the substrates can be inexpensively processed.

In addition, the substrate processing apparatus of the present invention may further comprise a rinse unit that rinses a substrate by immersing the substrate into a water stored therein, wherein the rinse unit includes a plurality of accommodating parts each of which is capable of simultaneously accommodating one or more substrates whose number is less than the number of substrates that can be simultaneously accommodated in the processing bath. According to this substrate processing apparatus, since a substrate can be rinsed by immersing the substrate into a water, the substrate can be rapidly rinsed. Further, since the rinse unit includes the plurality of accommodating parts, processed substrates can be sequentially received by the different accommodating parts. According to this method, it is possible to prevent that particles, which adhere to a substrate that has been just transferred to the accommodating part, adhere to a substrate which has been already accommodated in the accommodating part and has been subjected to the rinse process ("transfer of particles").

In this substrate processing apparatus, the plurality of accommodating parts may be formed as separate baths that are spaced apart from each other. According to this substrate processing apparatus, the transfer of particles can be more securely prevented.

Alternatively, in this substrate processing apparatus, the rinse unit may include a bath having therein a partition member, and an inside of the bath may be divided into the plurality of accommodating parts by the partition member. According to this substrate processing apparatus, a structure of the rinse unit can be simplified. Further, such a rinse unit can be manufactured by simply improving an existing bath.

In addition, the substrate processing apparatus of the present invention may further comprise a control device connected to the rinse unit, wherein the control device sets, for each of the accommodating parts, an amount of water per unit time to be replenished into each of the accommodating parts of the rinse unit. According to this substrate processing apparatus, an amount of water to be replenished into each accommodating part can be changed in accordance with conditions of the accommodating part. Thus, a substrate can be rapidly rinsed, and an amount of water to be used for the rinse process can be decreased.

In addition, in the substrate processing apparatus of the present invention, the transfer unit may be configured to transfer one or more substrates that has been processed in the processing bath to the rinse unit, and to further transfer the substrate that has been rinsed in the rinse unit to the processing unit. In this substrate processing apparatus, the number of the substrates that can be simultaneously accommodated in one of the accommodating parts may be not less than the number of the substrates that can be simultaneously transferred by the transfer unit. According to this substrate processing apparatus, substrates that have been simultaneously transferred from processing bath can be received in the same accommodating part. According to this method, the transfer of particles can be more securely prevented.

In addition, the substrate processing apparatus of the present invention may further comprise a movable shutter disposed above an upper opening of the processing bath; and a control device that controls a position of the movable shutter relative to the processing bath; wherein the control device controls the movable shutter, in order to convey a substrate between the transfer unit and the processing bath, in such a manner that a part that is above a position on which the substrate is to be placed in the processing bath is opened. According to this substrate processing apparatus, heat release from the process liquid stored in the processing bath can be restrained.

In this substrate processing apparatus, the movable shutter may include two plate-like members that are capable of moving above the upper opening of the processing bath, and the control device may control the movable shutter in such a manner that the two plate-like members are separated from each other to form a gap therebetween, so that the part that is above the position on which the substrate is to be placed in the processing bath is opened by the gap between the two plate-like members. According to this substrate processing apparatus, heat release from the process liquid via the opening can be more reduced. In this substrate processing apparatus, the control device may control the movable shutter in such a manner that relative positions of the two plate-like members are changed, so that a size of the gap is changed in accordance with the number of substrates to be simultaneously conveyed.

According to this substrate processing apparatus, heat release from the process liquid via the opening can be more reduced.

In addition, in this substrate processing apparatus, a baffle plate projecting from the movable shutter may be disposed near the opening. According to this substrate processing apparatus, there can be prevented promotion of heat exchange, which may be caused by an airflow of an atmosphere around the processing bath, between the atmosphere and the process liquid.

In addition, in the substrate processing apparatus of the present invention, the processing unit, the processing bath, and the transfer unit may be located in a space defined by a partition wall, and there may be provided a closable opening which is capable of communicating the processing unit and an outside of the space with each other.

In addition, the substrate processing apparatus of the present invention may further comprise: a partition wall that defines a space in which the processing unit, the processing bath and the transfer unit; and a conveying apparatus disposed outside the space, the conveying apparatus conveying a substrate to and from the space; wherein the conveying apparatus can directly convey a substrate to and from the processing unit.

In addition, the substrate processing apparatus of the present invention may further comprise: a partition wall that defines a space in which the processing unit, the processing bath and the transfer unit; and a conveying apparatus disposed outside the space, the conveying apparatus conveying a substrate to and from the space; wherein the processing unit is disposed in the space near a part, adjacent to the conveying apparatus, of the partition wall. This substrate processing apparatus may further comprise a conveying unit located near the part, adjacent to the conveying apparatus, of the partition wall, wherein the conveying apparatus brings a substrate into the conveying unit when the substrate is loaded into the space, and the conveying apparatus takes a substrate from the processing unit when a substrate is unloaded from the space. In addition, in this substrate processing apparatus, the processing bath may be positioned remoter from the conveying apparatus than the processing unit, or the processing unit and the conveying unit. In addition, in this substrate processing apparatus, the processing unit, or the processing unit and the conveying unit may be positioned between the processing bath and the conveying apparatus. In addition, in this substrate processing apparatus, the conveying apparatus may be capable of moving along the partition wall, and the processing unit and the conveying unit may be juxtaposed along the moving path of the conveying apparatus.

The substrate processing method of the present invention for processing a substrate with the use of a substrate processing apparatus including a processing unit capable of holding one substrate, and a processing bath that stores a process liquid and is capable of simultaneously accommodating a plurality of substrates, the substrate processing method comprises the steps of: judging whether a substrate to be processed that has been brought into the substrate processing apparatus is firstly transferred to the processing unit or the processing bath; and at least one of processing the substrate with the use of the processing unit, and processing the substrate by immersing the substrate into the process liquid stored in the processing bath; wherein the processing step in the processing bath includes the steps of: simultaneously transferring, to the processing bath storing the process liquid, one or more substrates whose number is less than the number of substrates that can be simultaneously accommodated in the processing bath; and processing the one or more substrates that have been simultaneously transferred, by immersing the one or more substrates into the process liquid in the processing bath, while circulatingly supplying a process liquid to the processing bath. According to the substrate processing method of the present invention, a process using a certain process liquid can be performed in the processing bath, and a process using another process liquid can be performed in the processing unit. When a substrate is processed in the processing bath, an amount of a process liquid to be used can be decreased by recycling the process liquid. Further, when a substrate is processed in the processing bath, a temperature of a heated process liquid in the processing bath can be maintained within a certain temperature range, so that change in temperature of the process liquid of a high temperature can be remarkably restrained. Furthermore, the number of the kinds of process liquids used in the processing unit can be reduced, while an overall structure of the substrate processing apparatus and control of the substrate processing apparatus can be simplified.

In the substrate processing method of the present invention, at the step of immersing the one or more substrates into the process liquid in the processing step in the processing bath, a substrate processing period in the processing bath may be regulated for every one or more substrates that have been simultaneously transferred. According to this substrate processing method, by sequentially loading substrate into the processing bath, a number of substrates can be concurrently processed. Thus, the substrates can be efficiently processed.

In addition, in the substrate processing method of the present invention, a movable shutter may be disposed above an upper opening of the processing bath, and the processing step in the processing bath may further include the step of moving the movable shutter in such a manner that, in order to load the one or more substrates into the processing bath, a part that is above a position on which the one or more substrates are placed in the processing bath is opened. According to this substrate processing method, heat release from the process liquid stored in the processing bath can be remarkably restrained.

In addition, the substrate processing method of the present invention may comprise both of the processing step with the use of the processing unit and the processing step in the processing bath, wherein the processing step with the use of the processing unit is performed after the processing step in the processing bath.

In this substrate processing method, the processing step with the use of the processing unit may include the steps of: holding, by the processing unit, one substrate that has been processed in the processing bath; rinsing the one substrate, that is held by the processing unit, by supplying water to the substrate; and drying the one substrate that is held by the processing unit and has been subjected to the rinse process by the processing unit. Alternatively, in this substrate processing method, the processing step with the use of the processing unit may include the steps of: holding, by the processing unit, one substrate that has been processed in the processing bath; processing the one substrate held by the processing unit, by supplying a process liquid that is different from the process liquid used at the processing step in the processing bath; rinsing the one substrate that is held by the processing unit and has been subjected to the process with the process liquid by the processing unit, by supplying water to the substrate; and drying the one substrate that is held by the processing unit and has been subjected to the rinse process by the processing unit.

In addition, the substrate processing method of the present invention may further comprise the step of rinsing the substrate by immersing the substrate into water stored in a rinse unit, the step being performed after the step of processing the substrate by immersing the substrate into the process liquid stored in the processing bath, wherein the rinse unit includes a plurality of accommodating parts each of which is capable of simultaneously accommodating one or more substrates whose number is less than the number of substrates that can be simultaneously accommodated in the processing bath, the rinsing step in the rinse unit includes the steps of: transferring one or more substrates to one of the accommodating parts of the rinse unit storing the water, the one accommodating part not accommodating a substrate; and rinsing the one or more substrates in the accommodating part of the rinse unit, by immersing the one or more substrates into water. According to this substrate processing method, since a substrate can be rinsed by immersing the substrate into a water in the rinse unit, the substrate can be rapidly rinsed. Further, since the processed substrates can be sequentially received by the accommodating part not accommodating a substrate, it is possible to prevent that particles, which adhere to a substrate that has been just transferred to the accommodating part, adhere to a substrate which has been already accommodated in the accommodating part and has been subjected to the rinse process ("transfer of particles").

In this substrate processing method, the one or more substrates that have been simultaneously transferred into the processing bath may be simultaneously transferred into the rinse unit. According to this substrate processing method, the one or more substrates, which are simultaneously transferred to the processing bath, are all together subjected to a process in the processing bath, transferred from the processing bath to the rinse unit, and subjected to a rinse process in the rinse unit. In addition, at the rinsing step in the rinse unit of this substrate processing method, an amount of water to be replenished into the one accommodating part accommodating the one or more substrates may be set independently from an amount of water to be replenished into other accommodating parts. According to this substrate processing method, an amount of water to be replenished into each accommodating part can be changed in accordance with conditions of the accommodating part. Thus, a substrate can be rapidly rinsed, and an amount of water to be used for the rinse process can be decreased.

In addition, this substrate processing method may comprise both of the processing step with the use of the processing unit and the processing step in the processing bath, wherein the processing step with the use of the processing unit is performed after the processing step in the processing bath. In this substrate processing method, the processing step with the use of the processing unit may include the steps of: holding, by the processing unit, the one substrate that has been rinsed in the rinse unit; and drying the one substrate held by the processing unit. In addition, in this substrate processing method, the processing step with the use of the processing unit may include the steps of: holding, by the processing unit, the one substrate that has been rinsed in the rinse unit; processing the one substrate held by the processing unit, by supplying a process liquid that is different from the process liquid that has been used in the processing step in the processing bath; rinsing the one substrate held by the processing unit, by supplying water to the substrate; and drying the one substrate that is held by the processing unit and has been subjected to the rinse process by the processing unit.

A program of the present invention is a program executed by a control device that controls a substrate processing apparatus including a processing unit capable of holding one substrate and a processing bath that stores a process liquid and that is capable of simultaneously accommodating a plurality of substrates, the program causing, when it is executed by the control device, the substrate processing apparatus to perform a substrate processing method comprising the steps of: judging whether a substrate to be processed that has been brought into the substrate processing apparatus is firstly transferred to the processing unit or the processing bath first; and at least one of processing the substrate with the use of the processing unit, and processing the substrate by immersing the substrate into the process liquid stored in the processing bath; wherein the processing step in the processing bath includes the steps of: simultaneously transferring, to the processing bath storing the process liquid, one or more substrates whose number is less than the number of substrates that can be simultaneously accommodated in the processing bath; and processing the one or more substrates that have been simultaneously transferred, by immersing the one or more substrates into the process liquid in the processing bath, while circulatingly supplying a process liquid to the processing bath.

A recording medium according to the present invention is a recording medium storing a program of the present invention is a program executed by a control device that controls a substrate processing apparatus including a processing unit capable of holding one substrate and a processing bath that stores a process liquid and that is capable of simultaneously accommodating a plurality of substrates, the program causing, when it is executed by the control device, the substrate processing apparatus to perform a substrate processing method comprising the steps of: judging whether a substrate to be processed that has been brought into the substrate processing apparatus is firstly transferred to the processing unit or the processing bath first; and at least one of processing the substrate with the use of the processing unit, and processing the substrate by immersing the substrate into the process liquid stored in the processing bath; wherein the processing step in the processing bath includes the steps of: simultaneously transferring, to the processing bath storing the process liquid, one or more substrates whose number is less than the number of substrates that can be simultaneously accommodated in the processing bath; and processing the one or more substrates that have been simultaneously transferred, by immersing the one or more substrates into the process liquid in the processing bath, while circulatingly supplying a process liquid to the processing bath.

BRIEF DESCRIPTION OF THE DRAWINGS

FIG. 5 is a top view showing the processing bath shown in FIG. 3 and the rinse unit shown in FIG. 4, together with a movable shutter;

FIG. 12 is a longitudinal sectional view showing a modification of the rinse unit; and FIG. 13 is a view, which corresponds to FIG. 3, showing a modification of the movable shutter together with the processing bath.

DESCRIPTION OF THE PREFERRED EMBODIMENT

An embodiment of the present invention will be described below, with reference to the drawings. In the following embodiment, an example is described in which a substrate processing apparatus of the present invention is applied to a processing apparatus for a semiconductor wafer. However, not limited to the application to the process for a semiconductor wafer, the substrate processing apparatus of the present invention may be broadly applied to a process for a substrate.

Figure 1:
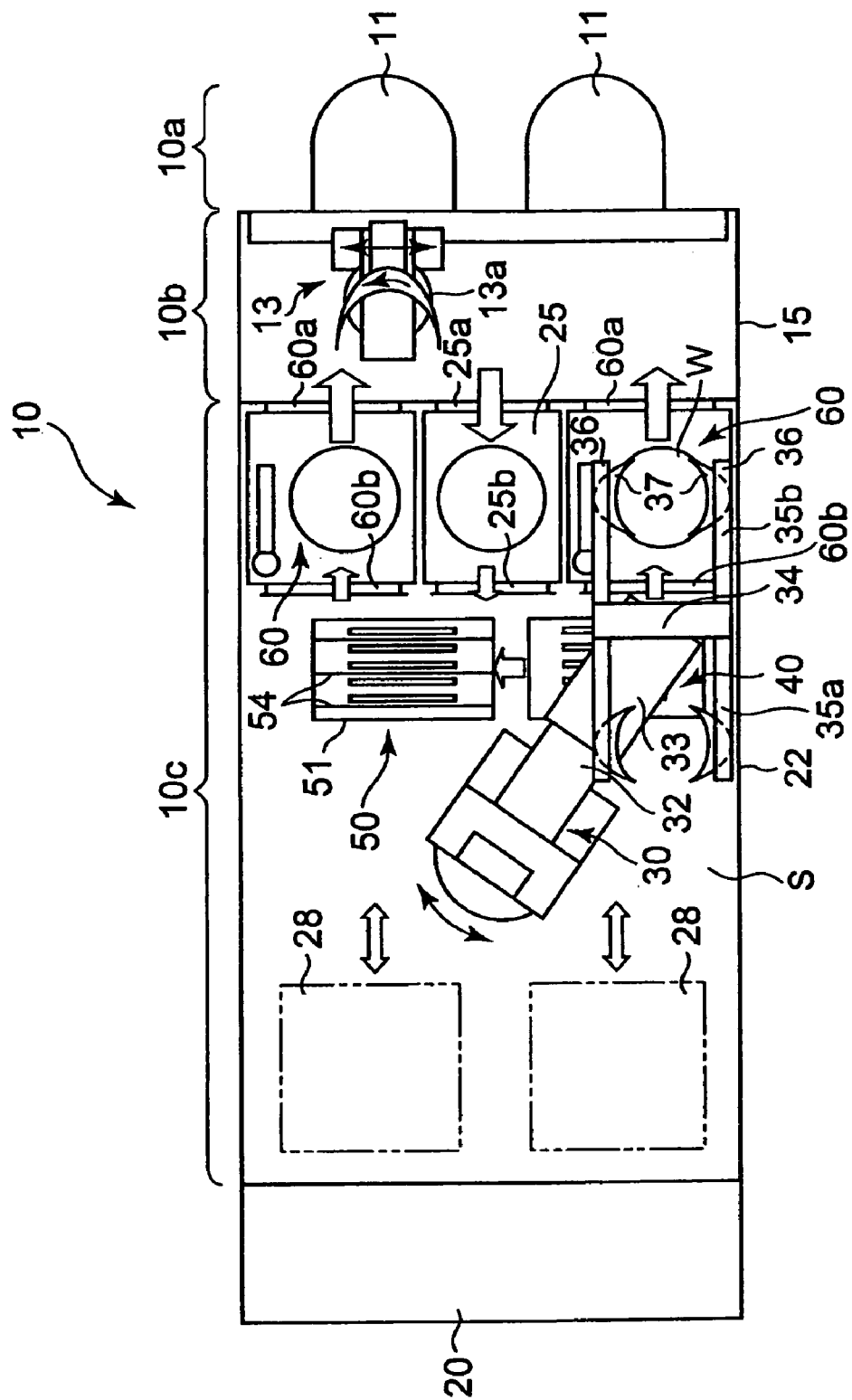
FIG. 1 is a top view showing an inner structure of a substrate processing apparatus in one embodiment of the present invention.
Figure 2:
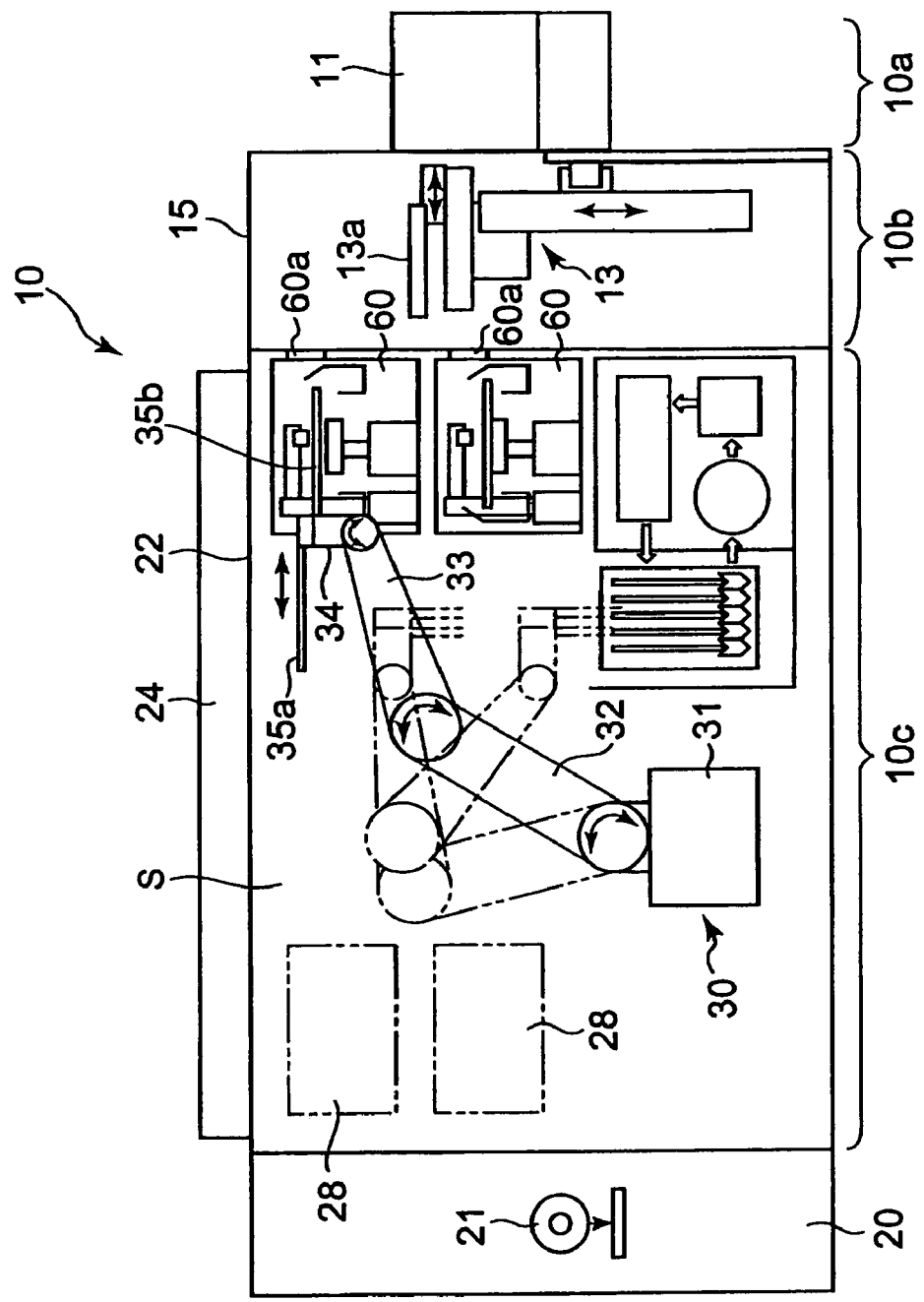
FIG. 2 is a side view showing the inner structure of the substrate processing apparatus shown in FIG. 1.
Figure 3:
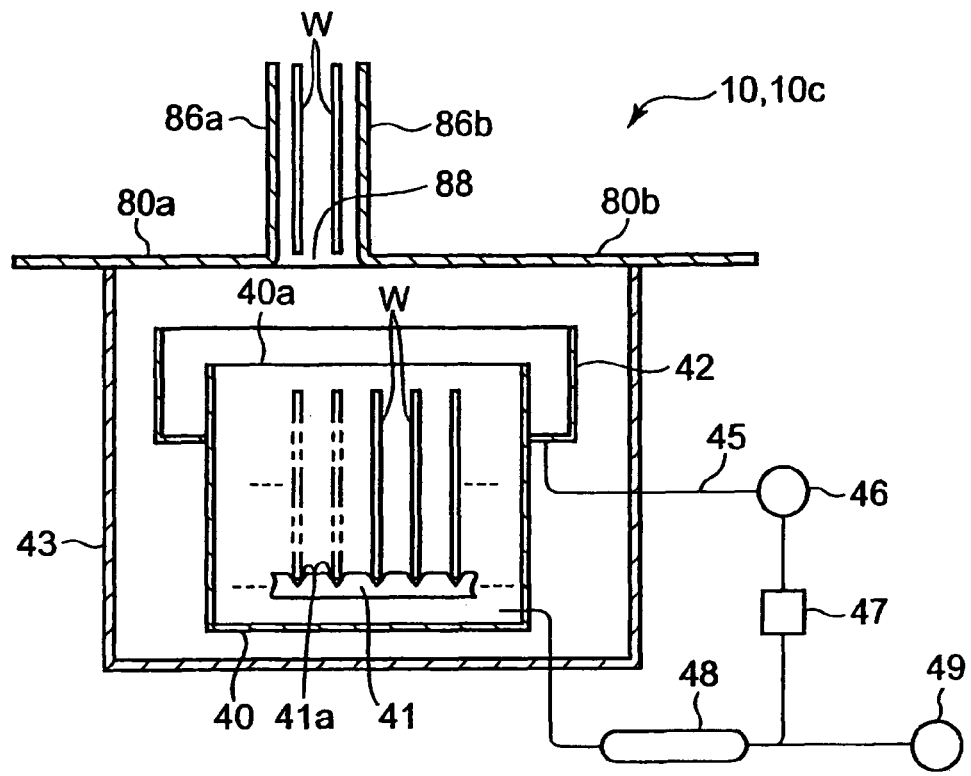
FIG. 3 is a longitudinal sectional view showing a processing bath of the substrate processing apparatus shown in FIG. 1.
Figure 4:
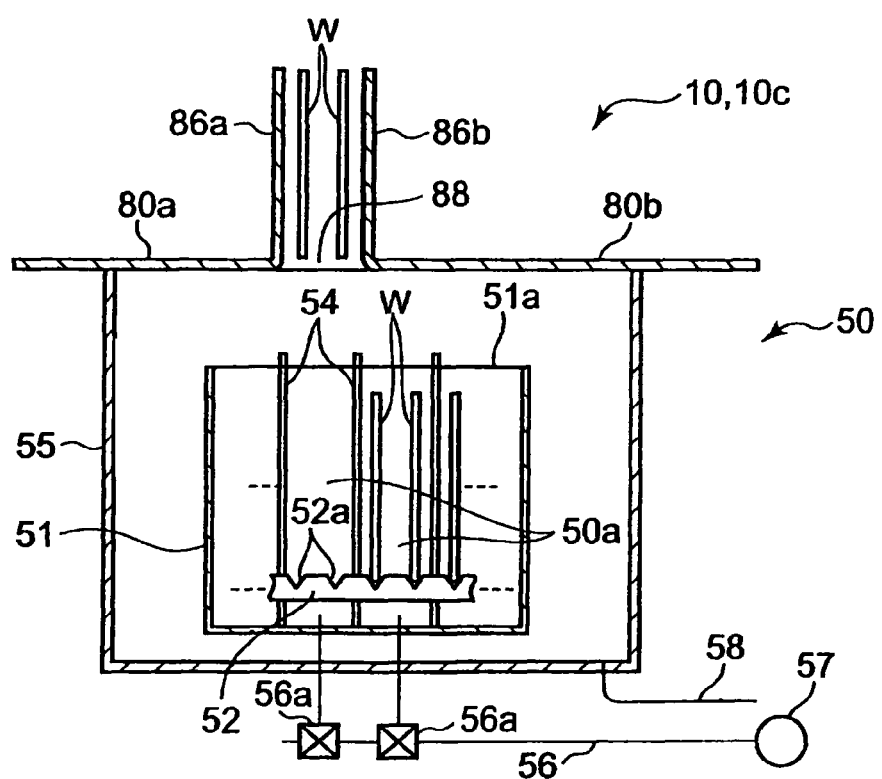
FIG. 4 is a longitudinal sectional view showing a rinse unit of the substrate processing apparatus shown in FIG. 1.
Figure 6:
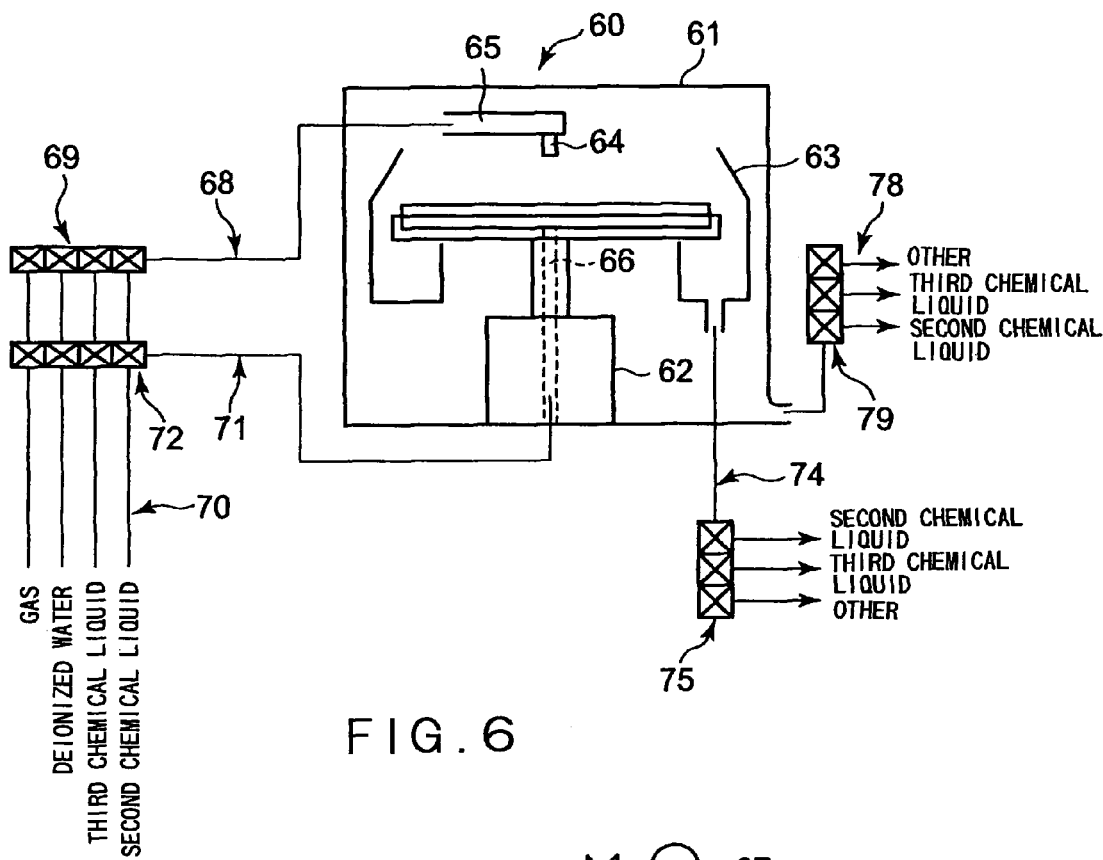
FIG. 6 is a schematic view showing a single-wafer processing unit of the substrate processing apparatus shown in FIG. 1.
Figure 7:
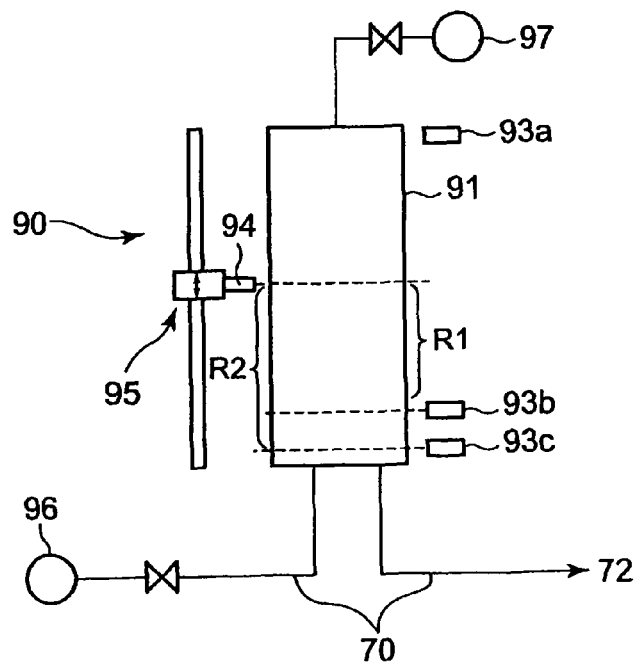
FIG. 7 is a schematic view for explaining a structure of a detector for detecting an unusual condition of a supplied liquid amount incorporated in the processing unit shown in FIG. 6.

FIGS. 1 to 13 are views for explaining one embodiment and other examples of a substrate processing apparatus and a substrate processing method of the present invention. Of these drawings, FIG. 1 is a top view showing an inner structure of a substrate processing apparatus in one embodiment of the present invention; FIG. 2 is a side view showing the inner structure of the substrate processing apparatus; FIG. 3 is a longitudinal sectional view showing a processing bath of the substrate processing apparatus; FIG. 4 is a longitudinal sectional view showing a rinse unit of the substrate processing apparatus; FIG. 5 is a top view showing the processing bath and the rinse unit, together with a movable shutter; FIG. 6 is a schematic view showing a single-wafer processing unit of the substrate processing apparatus; and FIG. 7 is a schematic view for explaining a structure of a detector for detecting an unusual condition of a supplied liquid amount incorporated in the processing unit.

As shown in FIGS. 1 and 2, a substrate processing apparatus 10 includes: a table part 10a on which a wafer W to be processed and a processed wafer W are placed; a processing part 10c in which a wafer W is processed; a transit part 10b through which a wafer W is conveyed between the table part 10a and the processing part 10c; and a control device 20 for controlling operations of various members disposed in the respective parts 10a, 10b, and 10c.

A carrier 11 that accommodates a plurality of wafers W is placed in the table part 10a. Disposed in the transit part 10b is a conveying apparatus 13 that conveys a wafer W between the table part 10a and the processing part 10c. The conveying apparatus 13 has one or more fork(s) 13a for holding a wafer W. As shown in FIGS. 1 and 2, the conveying apparatus 13 can move the fork 13a in an up and down direction, a right and left direction, and a back and forth direction. In addition, the conveying apparatus 13 can change an orientation of the fork 13a about a vertical axis. Due to this structure, the conveying apparatus 13 is configured to deliver a wafer W, which has been received from one of the table part 10a and the processing part 10c, to the other of the table part 10a and the processing part 10c.

As shown in FIGS. 1 and 2, the transit part 10b is isolated from outside by a partition wall 15. Conveying of a wafer W between the transit part 10b and the table part 10a and conveying of a wafer W between the transit part 10b and the processing part 10c are performed through an opening which is closed other than when a wafer W is conveyed.

Next, the processing part 10c is described. As shown in FIGS. 1 and 2, the processing part 10c is provided with a partition wall 22 that defines a space S in which equipments are arranged, and a blower 24 disposed on an upper part of the partition wall 22. The arrangement space S is isolated from outside by the partition wall 22. The blower 24 blows a cleaned gas into the defined space S from above. Because of the an airstream from the blower 24, a downflow can be formed inside the space S defined by the partition wall 22.

As shown in FIGS. 1 and 2, the substrate processing apparatus 10 includes: a conveying unit 25 that sends and receives a wafer W to and from the transit part 10b; a transfer unit 30 capable of transferring a wafer W in the space S defined by the partition wall 22; a processing bath 40 capable of simultaneously accommodating some or some tens of wafers W and of storing a process liquid; a rinse unit 50 capable of accommodating one or more wafers W and of storing a water (pure water, deionized water (in this embodiment)) deionized water; and a single-wafer processing unit 60 that holds a wafer W and processes the wafer W held by the same; in the space S defined by the partition wall 22. In this embodiment, two conveying units 25 are vertically stacked in the space S. In addition, four processing units 60 in total are vertically stacked on opposite sides of the conveying units 25 in the space S. The processing bath 40 and the rinse unit 50 are juxtaposed to each other. The transfer unit 30 is capable of simultaneously transferring one or more wafers W whose number is less than the number of wafers that can be simultaneously accommodated in the processing bath 40, and takes charge of all the transfer operations of wafers W in the processing part 10c. The respective members are sequentially described in detail.

The illustrated arrangement is merely an example, and can be suitably varied. For example, as shown by the two-dot chain lines in FIGS. 1 and 2, additional processing apparatuses 28 may be disposed in the space S defined by the partition wall 22.

The "process liquid" used herein means a liquid used in a process, and is a concept including a chemical liquid and a water (deionized water).

The conveying unit 25 is described in detail at first. As described above, the two vertically stacked conveying units 25 are disposed in the processing part 10c. Each of the conveying units 25 is capable of being communicated with the transit part 10b through an opening 25a that is closed other than when a wafer W is conveyed therethrough. When the opening 25a is opened, the fork 13a of the conveying apparatus 13 can enter the conveying unit 25. In addition, the transfer unit 30 is configured to enter each of the conveying units 25 through another opening 25b that is closed other than when a wafer W is conveyed therethrough. The transfer unit 30 and the conveying apparatus 13 are configured to deliver a wafer W into the conveying unit 25, and to receive a wafer W accommodated in the conveying unit 25. In this embodiment, each of the conveying units 25 can accommodate a plurality of, e.g., two wafers W.

Then, the transfer unit 30 is described in detail. As described above, the transfer unit 30 is capable of simultaneously transferring wafers W whose number is less than the number of wafers that can be simultaneously accommodated in the processing bath 40, specifically two wafers W. The transfer unit 30 can receive a wafer W from the conveying unit 25, the processing bath 40, the rinse unit 50, and the processing unit 60. In addition, the transfer unit 30 can deliver a wafer W to the conveying unit 25, the processing bath 40, the rinse unit 50, and the processing unit 60.

To be more specific, as shown in FIGS. 1 and 2, the transfer unit 30 includes a base seat 31, a first arm 32 connected to the base seat 31, a second arm 33 connected to the first arm 32, a support arm 34 connected to the second arm 33, and a first fork 35a and a second fork 35b that are supported by the support arm 34. The first arm 32 can be rotated in a horizontal plane with respect to the base seat 31. The first arm 32 can be swung in a vertical plane with respect to the base seat 31. The second arm 33 can be pivotally moved in the vertical plane with respect to the first arm 32. The support arm 34 can be pivotally moved in the vertical plane with respect to the second arm 33. The support arm 34 can be rotated in the horizontal plane with respect to the second arm 33. The first fork 35a and the second fork 35b can be slid independently from each other with respect to the support arm 34. Due to the above structure of the transfer unit 30, the first fork 35a and the second fork 35b can be moved to a desired position in the processing part 10c.

In this embodiment, as shown in FIG. 1, each of the first fork 35a and the second fork 35b are equipped with a pair of holding arms 36 and 36, and a contact portions 37 attached to the respective holding arms 36. The pair of holding arms 36 and 36 can move close to each other and can move away from each other. The contact portion 37 has an outer contour corresponding to a profile of a wafer W to be held. By moving the pair of arms 36 and 36 close to each other so as to bring the contact portions 37 into contact with a wafer W, each of the first fork 35a and the second fork 35b can sandwich and hold the wafer W between the pair of arms 36 and 36. On the other hand, by moving the pair of arms 36 and 36 away from each other, each of the first fork 35a and the second fork 35b can release the wafer W sandwiched between the arms 36 and 36.

This transfer unit 30 is connected to the control device 20, and is operated based on a control signal from the control device 20.

Next, referring mainly to FIGS. 1 to 3, the processing bath 40 is described below. As shown in FIGS. 1 to 3, the processing bath 40 has substantially a rectangular parallelepiped contour. The processing bath 40 is provided with an upper opening 40a through which a wafer W can pass.

As shown in FIGS. 1 to 3, the processing bath 40 can accommodate some or some tens of wafers W with equal intervals therebetween such that a plate surface of each wafer W is oriented along the vertical direction. The number of wafers that can be simultaneously accommodated in the processing bath 40 is larger than the number of wafers that can be simultaneously transferred by the transfer unit 30. A wafer boat 41 is disposed in the processing bath 40. Formed in the wafer boat 41 are grooves 41a formed at substantially equal intervals therebetween, each of which is capable of being engaged with a circumferential portion of a wafer W. By engaging the groove 41a of the wafer boat 41 and the circumferential portion of a wafer W, the wafer is supported by the wafer boat 41 in a standing condition. As shown in FIG. 3, an outer bath (collecting bath) 42 is disposed to surround the upper opening 40a of the processing bath 40. A process liquid overflown from the processing bath 40 can be collected in the outer bath 42.

As shown in FIG. 3, the processing bath 40 and the outer bath 42 are disposed in a processing bath sink 43. The processing bath sink 43 has substantially a rectangular parallelepiped contour, and has an upper opening. A pair of movable shutters 80a and 80b formed of plate-like members are disposed in the upper opening of the processing bath sink 43. The movable shutters 80a and 80b can be moved on an upper part of the processing bath sink 43, i.e., above the upper opening 40a of the processing bath 40. Thus, in order to convey a wafer W between the transfer unit 30 and the processing bath 40, a part that is above a position on which a wafer W to be delivered into the processing bath 40 will be placed, or on which a wafer to be taken out from the processing bath 4 is placed, can be opened. Structures of the movable shutters 80a and 80b are described in detail afterward.

The processing bath 40 is a bath storing a process liquid in which a wafer W is immersed and processed. The processing bath 40 is adapted to store, for example, a first heated chemical liquid such as a sulfur solution maintained at, e.g., 80° C. As shown in FIG. 3, disposed between the outer bath 42 and the processing bath 40 is a circulation line 45 which is equipped with a process-liquid delivering mechanism 46 such as a pump, a filter 47, and a heater 48. Namely, a process liquid overflown into the outer bath 42 passes through the circulation line 45 by the liquid delivering mechanism 46 so as to be returned into the processing bath 40. At this time, particles or the like mixed in the process liquid are removed by the filter 47. Further, a temperature of the process liquid flowing through the circulation line 45 is adjusted by the heater 48 such that the temperature of the process liquid in the processing bath 40 can be maintained within a predetermined range. Owing to the recycling method of the process liquid, the process liquid can be circulatingly reused without losing the same. Note that, the circulation line 45 is also connected to a process-liquid source 49, so that a fresh process liquid can be suitably supplied into the processing bath 40.

The process-liquid delivering mechanism 46 and the heater 48 are connected to the control device 20, and supply of the process liquid into the processing bath 40 and temperature adjustment of the process liquid are controlled by the control device 20.

Next, referring mainly to FIGS. 1, 2, and 4, the rinse unit 50 is described in detail. The rinse unit 50 is a unit that stores a deionized water (DIW) in which a wafer W is immersed and rinsed.

As shown in FIGS. 1, 2, and 4, the rinse unit 50 includes a plurality of accommodating parts 50a each of which is capable of accommodating wafers W whose number is less than the number of wafers that can be simultaneously accommodated in the processing bath 40. In this embodiment, the rinse unit 50 includes a rinse bath 51 for storing a deionized water and a wafer boat 52 disposed in the rinse bath 51. In this embodiment, the rinse bath 51 is structured in the same manner as the processing bath 40. That is to say, the rinse bath 51 has substantially a rectangular parallelepiped contour, and has an upper opening 51a through which a wafer W can pass. The wafer boat 52 has the same structure as that of the wafer boat 41 disposed in the processing bath 40. That is to say, formed in the wafer boat 52 are grooves 52a at substantially equal intervals therebetween, each of which is capable of being engaged with a circumferential portion of a wafer W. Thus, as shown in FIGS. 1, 2, and 4, the rinse bath 51 can accommodate wafers W whose number is the same as the number of wafers accommodated in the processing bath 40 such that a plate surface of each wafer W is oriented along the vertical direction.

Meanwhile, a plurality of plate-like partition members 54 are disposed in the rinse bath 51. Thus, an inside of the rinse bath 51 is divided into the plurality of accommodating parts 50a. In this embodiment, the partition member 54 separates (isolates) adjacent accommodating parts 50a from each other in the rinse bath 51. As clearly shown in FIG. 4, the partition member 54 is extended upward beyond the upper opening 51a of the rinse bath 51. Thus, flowing of a deionized water from a certain accommodating part 50a into another accommodating part 50a adjacent to the certain accommodating part 50a can be completely prevented. In this embodiment, the number of wafers that can be simultaneously accommodated in the one accommodating part 50a is two which is the same as the number of wafers W that can be simultaneously transferred by the transfer unit 30.

As shown in FIGS. 1 and 5, the rinse bath 51 of the rinse unit 50 and the processing bath 40 are arranged (aligned) to each other such that plate surfaces of wafers W accommodated in the rinse bath 51 and plate surfaces of wafers W accommodated in the processing bath 40 are in parallel with each other. More specifically, by shifting the positions of the wafers W held in the processing bath 40 in a direction parallel to the plate surfaces of the wafers W, there are present positions on which wafers W are to be held in the rinse bath 51.

As shown in FIG. 4, the rinse bath 51 is disposed in a rinse bath sink 55. The rinse bath sink 55 is structured in the same manner as the processing bath sink 43. That is to say, the rinse bath sink 55 has substantially a rectangular parallelepiped contour, and has an upper opening. Similar to the processing bath sink 43, the upper opening of the rinse bath sink 55 is covered with a pair of movable shutters 80a and 80b which are formed of plate-like members. In order to convey a wafer W between the transfer unit 30 and the rinse bath 51, a part that is above a position on which a wafer W to be delivered into the rinse bath 51 will be placed, or on which a wafer to be taken out from the rinse bath 51 is placed, can be opened.

The rinse unit 50 includes a deionized-water supply line 56 connecting the rinse bath 51 and a deionized-water source 57 to each other. The deionized-water supply line 56 is connected to all the accommodating parts 50a via switching valves (on-off valves) 56a whose flow rates can be controlled, respectively. Thus, an amount of deionized water per unit time to be supplied into each of the accommodating parts 50a of the rinse unit 50 can be set for each accommodating part 50a, by operating the switching valve 56a corresponding to the accommodating part 50a. In this embodiment, a deionized water overflown from the rinse bath 51 is collected into the rinse bath sink 55, and is discarded therefrom through a draining line 58 connected to a lower part of the rinse bath sink 55.

The switching valves 56a for operating an amount of deionized water to be supplied into the respective accommodating parts 51a are connected to the control device 20, and the operation of the switching valves 56a are controlled by the control device 20.

Next, the movable shutters 80a and 80b are described in detail. As shown in FIGS. 3 to 5, the movable shutters 80a and 80b are disposed above the upper opening 40a of the processing bath 40 and above the upper opening 51a of the rinse bath 51. As clearly shown in FIG. 5, the movable shutters 80a and 80b are made of the plate-like members extending substantially parallel to the plate surfaces of the wafers W accommodated in the processing bath 40 or the rinse bath 51, in other words, substantially parallel to a direction in which the processing bath 40 and the rinse bath 51 are juxtaposed to each other.

Opposite ends of the respective movable shutters 80a and 80b are supported by support plate members 82. The respective movable shutters 80a and 80b are capable of moving on the support members 82 along a direction in which the wafers W are arranged in the processing bath 40 and the rinse bath 51. The pair of movable shutters 80a and 80b are connected to separated first driving means 81a and 81b, such as cylinders, so as to be relatively movable to each other. Thus, a width of a gap (opening) 88 formed between the pair of movable shutters 80a and 80b can be changed.

The support plate members 82 can be moved along the direction in which the wafers W are arranged in the processing bath 40 and the rinse bath 51. In the example shown in FIG. 5, the support member 82 is connected to a second driving means 83 such as a motor, and is moved by the driving means 83. Thus, the opening 88 formed between the pair of movable shutters 80a and 80b can be located at a position that is above a position on which a wafer W is to be placed in the processing bath 40 and the rinse bath 51, or at a position that is above a position from which a wafer W is to be taken out from the processing bath 40 and the rinse bath 51.

The first driving means 81a and 81b, and the second driving means 83 are connected to the control device. Positions of the pair of movable shutters 80a and 80b based on the operations of the first driving means 81a and 81b relative to the support members 82, and positions of the pair of support plate members 82 based on the operations of the second driving means 83 relative to the processing bath 40 and the rinse bath 51, are controlled by the control device 20.

As clearly shown in FIGS. 3 and 4, a first baffle plate 86a projecting upward is disposed on an edge portion of the first movable shutter 80a on a side of the second movable shutter 80b. Similarly, a second baffle plate 86b projecting upward is disposed on an edge portion of the second movable shutter 80b on a side of the first movable shutter 80a. As shown in FIG. 3, a projecting length of each of the baffle plates 86a and 86b projecting upward from the first and second movable shutters 80a and 80b is substantially the same as a diameter of a plate surface of a substantially discoid wafer W.

As described above, a downflow is formed in the processing part 10c by an airstream sent from the blower 24. The baffle plates 86a and 86b serve to decrease an amount of the airstream blowing into the processing bath 40 so as to restrain heat release from the process liquid in the processing bath 40.

Next, referring mainly to FIGS. 6 and 7, the single-wafer processing unit 60 is described in detail. As described above, the four processing units 60 in total are disposed in the processing part 10c. Each of the processing units 60 can be communicated with the transit part 10b via the opening 60a that is closed other than when a wafer W is conveyed therethrough. While the opening 60a is opened, the fork 13a of the above-described conveying apparatus 13 can enter each of the processing units 60. In addition, the transfer unit 30 can enter each of the processing units 60 via another opening 60b that is closed other than when a wafer W is conveyed therethrough. The transfer unit 30 and the conveying apparatus 13 are configured to deliver a wafer W into the processing unit 60 and to receive a wafer W accommodated in the processing unit 60.

The processing unit 60 includes: a holding mechanism 62 for holding one wafer W such that a plate surface of the wafer W is oriented along the horizontal plane; a cup 63 that is located outward the wafer held by the holding mechanism 62; an upper nozzle 64 that supplies (spouts) a process liquid and a gas onto a surface (upper surface) of the wafer W held by the holding mechanism 62; an arm 65 that supports the upper nozzle 64; and a lower nozzle 66 that is incorporated in the holding mechanism 62, and supplies (spouts) a process liquid onto a rear surface of the wafer W held by the holding mechanism 62. The holding mechanism 62 can hold a wafer W such that the wafer W can be rotated. The arm 65 can move the upper nozzle 64, whereby the upper nozzle 64 can be moved above the wafer W held by the holding mechanism 62 along the plate surface of the wafer W. As a result, a process liquid and a gas can be spouted toward a desired position on the plate surface of the wafer W through the upper nozzle 64. A process liquid, that has been supplied to the wafer W, is dispersed by the rotation of the wafer W, and is collected into the cup 63. The holding mechanism 62, the cup 63, the upper nozzle 64, the arm 65, and the lower nozzle 66 are installed in a processing chamber defined by a processing-unit partition wall 61.

Next, pipings connected to the processing unit 60 are described. As shown in FIG. 6, the upper nozzle 64 is connected to an upper supply line 68. The upper supply line 68 is connected to various process-liquid sources and gas sources through an upper supply valve 69 and a connecting line 70. The lower nozzle 66 is connected to a lower supply line 71. The lower supply line 71 is connected to various process-liquid sources and gas sources through a lower supply valve 72 and the connecting line 70. In this embodiment, as shown in FIG. 6, the upper supply line 68 and the lower supply line 71 are connected to the same process-liquid sources and gas sources. Concretely, the upper supply line 68 and the lower supply line 71 are connected to a second chemical-liquid source, a third chemical-liquid source, a deionized-water source, and an inert-gas source, through separate pipings included in the connecting line 70. In this case, a chemical liquid to be supplied from the second chemical-liquid source may be acid-based DHF ($HF/H_2O$), for example. A chemical liquid to be supplied from the third chemical-liquid source may be alkaline-based ammonia water, for example. Further, an inert gas to be supplied form the inert-gas source may be nitrogen.

As shown in FIG. 6, a discarding line 74 is connected to the cup 63 into which a process liquid that has been supplied onto a wafer W is collected. The discarding line 74 is equipped with a branching valve 75. By operating the branching valve 75, the discarding line 74 can discard the acid-based second chemical liquid, the alkaline-based third chemical liquid, and other liquids, separately from each other.

A ceiling surface of the processing-unit partition wall 61 is provided with an opening for airstream, not shown. Thus, a gas sent from the above-described blower 24 is blown into the processing-unit partition wall 61. Disposed in a lower part of the processing-unit partition wall 61 is a discharging line 78 for discharging an atmosphere inside the processing-unit partition wall 61. Thus, an atmosphere in the processing-unit partition wall 61 can be discharged through the discharging line 78, so that a downflow can be stably formed inside the processing-unit partition wall 61. In the illustrated example, a discharging valve 79 can be disposed in the discharging line 78. By operating the discharging valve 79, the discharging line 78 can discharge an atmosphere while the acid-based second chemical liquid is used, an atmosphere while the alkaline-based third chemical liquid is used, and atmospheres under other conditions, separately from each other.

As described above, in this embodiment, a process with the use of the first chemical liquid at a high temperature is performed not in the processing unit 60 but in the processing bath 40. Namely, there is no necessity for connecting, to the processing unit 60, pipings for a process with the use of the first chemical liquid. Thus, the structure of the processing unit 60 and the control of the processing unit 60 can be considerably simplified.

In addition, the connecting line 70, the discarding line 74, and the discharging line 78 are used in common to the plurality of processing units 60 included in the substrate processing apparatus 10 (in this embodiment, four processing units as described above). Thus, by omitting pipings for performing the process with the use of the first chemical liquid, the structure of the substrate processing apparatus 10 and the control of the substrate processing apparatus 10 can be considerably simplified.

The respective valves 69, 72, 75, and 79, the arm 65, the holding mechanism 62, and the respective process-liquid sources are connected to the control device 20. Processes for a wafer W in the processing unit 60 (specifically, supply of a process liquid, supply of a gas, holding of the wafer W by the holding mechanism 62, positioning of the upper nozzle) are controlled by the control device 20.

Note that the above-described structure of the processing unit 60 is merely taken by way of example, and is not limited to the illustrated example.

As shown in FIGS. 6 and 7, with respect to the piping for the second chemical liquid and the piping for the third chemical liquid, which are included in the connecting line 70, disposed between a chemical-liquid source 96 and the supply nozzles 64 and 66 is a detector 90 for detecting an unusual condition of a supplied liquid amount, which judges whether an amount of a process liquid that is supplied to a wafer W through the supply lines 68 and 71 is unusual or not. The detector 90 for detecting an unusual condition of a supplied liquid amount includes a supply bottle 91 in which a process liquid to be used for processing a wafer W is stored. The supply bottle 91 is an elongated container, and is supported to extend in the vertical direction. The supply bottle 91 is connected to the connecting line 70 at a lower surface thereof. The detector 90 for detecting an unusual condition of a supplied liquid amount includes an upper limit sensor 93a, a lower limit sensor 93b, and a bottom lower limit sensor 93c, which are located at different positions in a height direction of the supply bottle 91 (in the vertical direction). The detector 90 for detecting an unusual condition of a supplied liquid amount further includes an actuator 95 disposed near the supply bottle 91, and a liquid level sensor 94 that is supported by the actuator 95 so as to be movable in the height direction of the supply bottle 91 (in the vertical direction). Each of the sensors 93a, 93b, 93c, and 94 has a function for judging whether a liquid is stored or not in the supply bottle 91, up to a height at which each sensor is held.

The respective sensors 93a, 93b, 93c, and 94 are connected to the control device 20, and results judged by the respective sensors are sent to the control device 20. The actuator 95 is connected to the control device 20, so that the actuator 95 is operated by a signal from the control device 20. Information about an amount of each process liquid, which is required to process one wafer W in a process with the use of the process liquid, is recorded beforehand in the control device 20. Based on this recorded information, the control device 20 determines a height position at which the liquid level sensor 94 should be supported. More specifically, the liquid level sensor 94 is positioned such that a volume of a region R1 of the supply bottle 91, the region R1 occupying a space in the supply bottle 91 between the height position at which the liquid level sensor 94 is supported and the height position at which the lower limit sensor 93b is positioned, is smaller than the amount of the process liquid required to process one wafer W, and such that a volume of a region R2 of the supply bottle 91, the region R2 occupying a space in the supply bottle 91 between the height position at which the liquid level sensor 94 is supported and the height position at which the bottom lower limit sensor 93c is positioned is greater than the amount of the process liquid required to process one wafer W.

According to the detector 90 for detecting an unusual condition of a supplied liquid amount, it is possible to judge whether an appropriate amount of the process liquid could be supplied to the wafer W or not, by storing, before a wafer W is processed, a process liquid in the supply bottle 91 up to a height of the liquid level sensor 94, and by confirming a liquid level height of the process liquid remaining in the supply bottle 91 upon completion of the process of the wafer W. To be more specific, when the liquid level height of the remaining process liquid is between the lower limit sensor 93*b* and the bottom lower limit sensor 93*c*, it is judged that an appropriate amount of the process liquid has been supplied. When the liquid level height of the remaining process liquid is higher than the lower limit sensor 93*b*, it is judged that a supply amount of the process liquid is not enough. When the liquid level height of the remaining process liquid is lower than the bottom lower limit sensor 93*c*, it is judged that a supply amount of the process liquid is excessive. The upper limit sensor 93*a* is disposed for detecting a case in which a process liquid is excessively supplied into supply bottle 91 before a wafer W is processed.

A commercially available flow rate sensor may make a mistake when supply of a liquid is started and stopped, or when bubbles are contained in a liquid. Further, a commercially available flow rate sensor is significantly expensive. On the other hand, the detector 90 for detecting an unusual condition of a supplied liquid amount, which is inexpensive, can stably judge whether a supplied liquid amount is unusual or not.

As shown in FIG. 7, the supply bottle 91 is connected to a gas source 97 at an upper surface thereof. By supplying a gas from the gas source 97 so as to increase a pressure in the supply bottle 91, a process liquid stored in the supply bottle 91 can be discharged from the supply bottle 91.

Next, the control device 20 is described. The control device 20 includes a CPU capable of reading a recording medium 21, and is configured to control operations of the respective constituent elements of the substrate processing apparatus 10. A program for executing a process performed by the substrate processing apparatus 10 is recorded in the recording medium 21. Based on the program previously recorded in the recording medium 21, the control device 20 causes the respective constituent elements of the substrate processing apparatus 10 to process a wafer W. The recording medium 21 may be formed of a memory such as a ROM and a RAM, a disc-shaped recording medium such as a hard disc and a CD-ROM, and other publicly known recording medium.

Next, there is described an example of a method of processing a wafer W by using the substrate processing apparatus 10 as described above. Operations of the respective constituent elements of the substrate processing apparatus 10 described herebelow are controlled by control signals from the control device 20 based on the program previously stored in the program recording medium 21.

At first, as described above, the carrier 11 accommodating a plurality of wafers W is placed on the table part 10*a*. The wafers W in the carrier 11 are drawn out from the carrier 11 by the conveying apparatus 13 located in the transit part 10*b*, and are brought into the conveying unit 25.

A method of processing the wafers W in the processing part 10*c* is described below.

Figure 8:
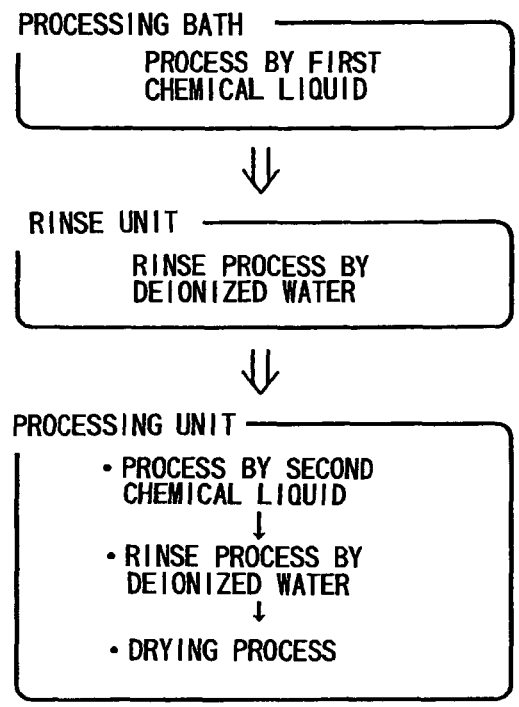
FIG. 8 is a flowchart for explaining a substrate processing method in one embodiment of the present invention, the substrate processing method being capable of being performed by the substrate processing apparatus shown in FIG. 1.

Firstly, based on the program recorded in the recording medium 21, the control device 20 judges whether the wafers W to be processed that have been brought into the processing part 10*c* are firstly transferred to the processing unit 60 or the processing bath 40. In the example described below, as shown in FIG. 8, the wafers W are transferred into the processing bath 40 at first.

Specifically, the wafers W to be processed accommodated in the conveying unit 25 are held by the transfer unit 30, and are brought out from the conveying unit 25. Postures of the brought-out wafers W are changed from a horizontal condition to a vertical condition, and the wafers W are loaded into the processing bath 40 by the transfer unit 30. At this time, the transfer unit 30 simultaneously holds two wafers W which have been accommodated in the conveying unit 25, by means of the two forks 35*a* and 35*b*, and simultaneously transfers the two wafers W into the processing bath 40.

A first chemical liquid (e.g., sulfur solution) is stored in the processing bath 40 into which the wafers W are loaded. The liquid delivering mechanism 46 and the heater 48 are in operation. Thus, the first chemical liquid is heated while it is circulated through a circulation path formed by the processing bath 40, the outer bath 42, and the circulation line 45. As a result, a temperature of the first chemical liquid in the processing bath 40 is maintained within a predetermined range which is higher than a room temperature.

Before the wafers W are loaded into the processing bath 40, the movable shutters 80*a* and 80*b* are moved so that the opening (gap) 88 through which the wafers W are loaded is formed at a position above a part on which the two wafers W are to be placed in the processing bath 40. Namely, by the movement of the movable shutters 80*a* and 80*b*, the part that is above the position on which the two wafers W are to be placed in the processing bath 40 is opened. In this embodiment, the two wafers W that are simultaneously transferred by the transfer unit 30 is positioned to be adjacent to each other in the processing bath 40. Specifically, based on a signal from the control device 20, the first driving means 81*a* and 81*b* relatively move the movable shutters 80*a* and 80*b* on the support plate members 82, so as to adjust a width of the opening (gap) 88 formed between the pair of movable shutters 80*a* and 80*b*. As shown in FIG. 3, the thus formed opening 88 has a width that allows the two wafers W held by the transfer unit 30 to pass the opening 88. Based on a signal from the control device 20, the support plate members 82 are moved above the upper opening 40*a* of the processing bath 40 by the second driving means 83, so that the opening 88 formed between the pair of movable shutters 80*a* and 80*b* are positioned immediately above a position on which the wafers W are to be placed in the processing bath 40.

In this manner, the two wafers W are simultaneously immersed into the first high-temperature chemical liquid (e.g., sulfur solution) stored in the processing bath 40, and a process (e.g., a resist removing process) for the two wafers W is started. In addition, the transfer unit 30 is continuously operated to transfer other wafers W based on a signal from the control device 20. Further, the movable shutters 80*a* and 80*b* are moved in order for loading the other wafers W into the processing bath 40 or for unloading other wafers W from the processing bath 40.

Then, the control device 20 measures an elapsed processing period for every two wafers that have been simultaneously transferred by the transfer unit 30 and loaded into the processing bath 40, and simultaneously immersed into the first chemical liquid. At a time when the elapsed processing period reaches a preset processing period, the control device 20 sends a signal to the transfer unit 30, so as to unload the wafers W from the processing bath 40. At the same time, the control device 20 sends signals to the first driving means 81*a* and 81*b* and the second driving means 82, so as to form the opening 88 above the two wafers W to be unloaded. In the above manner, the process for the two wafers W, that have been simultaneously loaded into the processing bath 40, in the processing bath 40 is finished.

As described above, as shown in FIG. 3, the processing bath 40 is capable of accommodating at a time wafers W whose number is greater than the number of wafers W that can be transferred by the transfer unit 30 at a time. Thus, while the process for the two wafers W, that have been simultaneously transferred, in the processing bath 40 is being performed, it is possible to sequentially bring wafers W to be subsequently processed into the processing bath 40 by the transfer unit 30, to thereby process the wafers W in other regions of the processing bath 40. In this manner, in the processing bath 40 capable of accommodating a number of wafers W, the wafers W can be concurrently, effectively processed. In addition, the processing periods of the respective wafers W to be concurrently processed can be made uniform, whereby non-uniformity in processing of the respective wafers W can be sufficiently restrained, and the wafers W can be stably processed.

The first chemical liquid in the processing bath 40 is circulated through the circulation path formed by the processing bath 42, the outer bath 42, and the circulation line 45, while the temperature of the first chemical liquid is being adjusted by the heater 48. Thus, although an amount of the first chemical liquid stored in the processing bath 40 is relatively large, a number of wafers can be sequentially processed by the same first chemical liquid. As a result, an amount of the first chemical liquid to be used can be decreased.

The first chemical liquid is circulated through the circulation path formed by the processing bath 40, the outer bath 42, and the circulation line 45, while the temperature of the first chemical liquid is being adjusted by the heater 48. In addition, a large amount of the first high-temperature chemical liquid is stored in the processing bath 40. Thus, even when wafers W whose temperature is lower than that of the first high-temperature chemical liquid are sequentially loaded into the processing bath 40, the temperature of the first chemical liquid stored in the processing bath 40 can be prevented from being drastically changed.

Moreover, since the movable shutters 80a and 80b are disposed above the upper opening 40a of the processing bath 40, heat release from the process liquid stored in the processing bath 40 can be restrained. In particular, the width of the gap (opening) 88 between the movable shutters 80a and 80b for conveying wafers W can be changed in accordance with the number of wafers W that are simultaneously conveyed. Thus, heat release from the first chemical liquid via the gap 88 can be reduced. In addition, the baffle plates 86a and 86b are projectingly disposed on the edge portions of the movable shutters 80a and 80b adjacent to the opening 88. Thus, blowing of an atmosphere around the processing bath into the processing bath 40, which is caused by a downflow formed in the processing part 10c, can be restrained, whereby promotion of heat exchange between the atmosphere around the processing bath 40 and the first chemical liquid in the processing bath 40 can be prevented.

Thereafter, as shown in FIG. 8, the two wafers W that have been simultaneously taken out from the processing bath 40 are received in the rinse bath 51 of the rinse unit 50. Specifically, the two wafers W to be transferred from the processing bath 40 to the rinse unit 50 are brought up by the transfer unit 30 such that the two wafers W are positioned between the baffle plates 86a and 86b. Then, the transfer unit 30 simultaneously transfers the two wafers W in a direction in parallel with the plate surfaces of the wafers W to be transferred, while a height position of the transfer unit 20 (a position in the up and down direction with respect to the plane of the drawing of FIG. 3) is maintained. When the two wafers W reach a position immediately above the rinse bath 51 of the rinse unit 50, the transfer unit 30 lowers the two wafers W. Thus, the two wafers W are simultaneously loaded into rinse unit 50 by the transfer unit 30. At this time, the wafers W that have been simultaneously transferred from the processing bath 40 are received in the same accommodating part 50a.

Namely, the wafers W that have been taken out from the processing bath 40 are received in the rinse bath 51 at positions corresponding to positions shifted, from the positions at which the wafers W have been held in the processing bath 40, along the direction parallel to the plate surfaces of the wafers W positioned in the processing bath 40. This transfer method can eliminate the need for moving the movable shutters 80a and 80b, to thereby accelerate the transfer operation. When the wafers W held by the transfer unit 30 are moved from a position above the processing bath 40 to a position above the rinse unit 50, the wafers W are moved between the pair of baffle plates 86a and 86b. Thus, it is considerably possible to restrain that liquid droplets of the first chemical liquid and particles adhering to the wafer W are dispersed in the processing part 10c, which might be caused by an airflow in the processing part 10c.

Meanwhile, a deionized water is stored in the rinse bath 51 of the rinse unit 50 into which the wafers W are loaded. The two wafers W are simultaneously immersed into the deionized water stored in the accommodating part 50a of the rinse unit 50, and a rinse process for the two wafers W is started. The transfer unit 30 is continuously operated based on a signal from the control device 20, so as to transfer other wafers W.

A deionized water is suitably replenished into the accommodating parts 50a of the rinse unit 50. In this embodiment, an amount of deionized water per unit time to be replenished into each of the accommodating parts 50a of the rinse unit 50 is set for each of the accommodating parts 50a, based on a signal from the control device 20. A large amount of deionized water is replenished into the accommodating part 50a in which the wafers W that have been processed by the chemical liquid are accommodated. On the other hand, a small amount of deionized water or no deionized water is replenished into the accommodating part 50a in which no wafer W is accommodated.

When a deionized water is replenished into the rinse bath 51, a deionized water is overflown from the upper opening 51a of the rinse bath 51. In this embodiment, as shown in FIG. 4, a deionized water is replenished into the rinse bath 51 from below. Thus, a liquid flow of deionized water directed from downward to upward is formed in the rinse bath 51. Particles removed from the wafers W in the rinse bath 51 are moved upward with the aid of the flow of water, and are overflown together with the deionized water from the rinse bath 51. The overflown particles are discarded together with the deionized water.

Thus, by changing an amount of water to be replenished into the accommodating part 50a in accordance with the condition of this accommodating part 50a, the wafers W can be rapidly rinsed, and an amount of deionized water to be used in the rinse process can be decreased.

As described above, the partition member 54 for dividing the rinse bath 51 into the respective accommodating parts separates the adjacent accommodating parts 50a from each other in the rinse bath 51. As clearly shown in FIG. 4, the partition member 54 extends upward beyond the upper opening 51a of the rinse bath 51. That is to say, the two adjacent accommodating parts 50a are not in liquid communication with each other. Thus, flowing of a deionized water from a certain accommodating part 50 into another accommodating part adjacent to the certain accommodating part 50a can be completely prevented. Namely, it is possible to prevent the first chemical liquid and particles, which have been removed from a wafer W in a certain accommodating part 50a, from flowing into another accommodating part adjacent to the certain accommodating part 50a.

Thus, during a rinse process of wafers W in a certain accommodating part 50a, even when other wafers W that have been just processed in the processing bath 40 are loaded into an adjacent accommodating part, particles adhering to the wafers W loaded into the adjacent accommodating part can be securely prevented from adhering to the wafers W which have been subjected to the rinse process before the other wafers W are loaded into an adjacent accommodating part 50a ("transfer of particles"). That is to say, it is possible to sequentially load wafers W, which have been subjected to a chemical liquid process, into the respective accommodating parts 50a in the rinse unit 50, so as to concurrently subject the wafers W to the rinse process in the respective accommodating parts 50a.

Similar to the process in the processing bath 40, the control device 20 measures an elapsed processing period of every two wafers that have been simultaneously transferred by the transfer unit 30 and loaded into the rinse unit 50. At a time when the elapsed processing period reaches a preset processing period, the control device 20 sends a signal to the transfer unit 30, so as to unload the wafers W from the rinse unit 50. At the same time, the control device 20 sends signals to the first driving means 81a and 81b and the second driving means 82, so as to form the opening 88 above the two wafers W to be unloaded. In the above manner, the process for the two wafers W, that have been simultaneously loaded into the rinse bath 50, in the rinse bath 50 is finished.

As described above, and as shown in FIG. 4, the rinse bath 50 includes the plurality of accommodating parts 50a. Each of the accommodating parts 50 is capable of accommodating wafers W whose number is the same as the number of wafers that can be simultaneously transferred by the transfer unit 30. Thus, while the rinse process is being performed in a certain accommodating part 50a to two wafers W that have been simultaneously transferred, it is possible to sequentially bring other wafers W to be subsequently processed into other accommodating parts 50a so as to perform the rinse process. In this manner, in the rinse unit 50 capable of accommodating a number of wafers W, the wafers W can be subjected concurrently, efficiently to the rinse process. In addition, the processing periods of the respective wafers W to be concurrently processed can be made uniform. Thus, the wafers W can be stably processed, while sufficiently restraining non-uniformity in processing of the respective wafers W.

Thereafter, as shown in FIG. 8, postures of the two wafers W that have been simultaneously taken out from the rinse unit 50 are changed from the vertical condition to the horizontal condition, and the wafers W are transferred to the processing units 60. As described above, each processing unit 60 can accommodate only one wafer W. Thus, the two wafers W held by the transfer unit 30 are separately loaded into the separate processing units 60 one by one.

In this embodiment, the four processing units 60 are disposed in the processing part 10c, as described above, and processes in the respective processing units 60 are concurrently performed. In the following description, a process for one wafer W in one processing unit 60 is described.

In this embodiment, as shown in FIG. 8, there are performed: a step of holding one wafer W by the processing unit 60, the wafer W having been subjected to the rinse process in the rinse unit 50; a step of processing the one wafer W held by the processing unit 60 by supplying a second chemical liquid that is different from the first chemical liquid used in the process performed in the processing bath 40; a step of rinsing the one wafer W held by the processing unit 60 by supplying a deionized water onto the one wafer W; and a process of drying the one wafer W that is held by the process unit 60 and has been subjected to the rinse process by the processing unit 60. The respective steps are described below.

At first, one wafer W, which has been transferred by the transfer unit 30 into the processing unit 60, is held by the holding mechanism 62 of the processing unit 60. The holding mechanism 62 rotates the wafer W having a substantially circular plate surface about the rotation axis which passes through a center of the plate surface. Before this operation or concurrently therewith, a second chemical liquid (e.g., hydrogen fluoride solution) is supplied into the supply bottle 91 of the detector 90 for detecting an unusual condition of a supplied liquid amount, up to a position at which there is supported the liquid level sensor 94 whose support height has been adjusted beforehand.

Then, the second chemical liquid stored in the supply bottle 91 is started to be supplied through the upper nozzle 64 onto a surface (upper surface) of the wafer W which is held in rotation by the holding mechanism 62. In this manner, the second chemical liquid (e.g., hydrogen fluoride solution) is supplied from the upper nozzle 64 to the one wafer W, and a process (e.g., oxide-film removal process) for the one wafer W is started. The upper nozzle 64 may be stopped at a position facing a central area of the plate surface of the wafer W, while continuously supplying the second chemical liquid to the central area of the plate surface of the wafer W. In this case, the second chemical liquid supplied to the central area of the wafer W automatically moves, in accordance with the rotation of the wafer W, from the central area of the plate surface of the wafer W to a peripheral area of the plate surface of the wafer W, so that the whole surface of the wafer W is processed. Alternatively, the upper nozzle 64 may be moved by the arm 65 above the wafer W along the plate surface of the wafer W, while supplying the second chemical liquid onto each area between the central area of the plate surface of the wafer W and the peripheral area of the plate surface of the wafer W.

When a period of supplying the second chemical liquid exceeds a preset period, the supply of the second chemical liquid from the supply bottle 91 to the upper nozzle 64 is stopped. Thus, the process of the wafer W with the use of the second chemical liquid is finished.

In this embodiment, the second chemical liquid is not supplied from the lower nozzle 66. However, not limited thereto, the second chemical liquid may be supplied onto a rear surface of the wafer W from the lower nozzle 66, for example, while the second chemical liquid is being supplied from the upper nozzle 64.

Then, the rinse process is performed to the one wafer W in the processing unit 60. Also in this step, the wafer W to be processed is held in rotation by the holding mechanism 62.

At first, the upper supply valve 69 is operated so that a deionized water is supplied from the upper nozzle 64 to the one wafer W. In this manner, the rinse process for one wafer W is started. Similar to the process using the second chemical liquid, the upper nozzle 64 may be stopped while continuously supplying a deionized water onto only the central area of the plate surface of the wafer W, or the upper nozzle 64 may be moved while supplying the second chemical liquid onto each area between the central area of the plate surface of the wafer W and the peripheral area of the plate surface of the wafer W.

When a period of supplying a deionized water exceeds a predetermined period, the supply of the deionized water from the upper nozzle 64 is stopped, so that the rinse process of the wafer W using a deionized water is finished.

In this embodiment, a deionized water is not supplied form the lower nozzle 66. However, not limited thereto, a deionized water may be supplied onto the rear surface of the wafer W form the lower nozzle 66, for example, while a deionized water is being supplied from the upper nozzle 64.

Then, the drying step is performed to the one wafer W in the processing unit 60. During this step, the wafer W to be processed is held in rotation at a high speed by the holding mechanism 62. By operating the upper supply valve 69, an inert gas is spouted from the upper nozzle 64 onto the one wafer W. At this time, it is preferable that the upper nozzle 64 spouts an inert gas to each area of the plate surface of the wafer W, while the upper nozzle 64 is moved from the center area of the plate surface of the wafer W toward the peripheral area of the plate surface of the wafer W. Due to the spout of the inert gas and the rotation of the wafer W, the deionized water on the wafer W is blown outside from the surface of the wafer W.

In this manner, the drying step of the wafer W in the processing unit 60 is finished. Then, a series of the processes for the wafer W in the processing unit 60 is finished by these processes. After that, the conveying apparatus 13 disposed in the transit part 10b unloads the processed wafer W from the processing unit 60 via the opening 60a, and then places the wafer W into the carrier 11 located on the table part 10a. In the manner as described above, the process for the one wafer W is completed.

The chemical liquid stored in the processing bath 50 and the deionized water stored in the rinse bath 51 may adhere to the first and second forks 35a and 35b of the transfer unit 30. Namely, in a case where a wafer W is held by the transfer unit 30, a liquid may again adhere to the dried wafer W. On the other hand, since no liquid adheres to the fork 13a of the conveying apparatus 13, the processed wafer W can be unloaded without being wetted.

According to this embodiment, in the processing part 10c defined by the partition wall 22, the substrate processing apparatus 10 used for processing a wafer W includes: the processing unit 60 that holds one wafer W and processes the wafer held by the processing unit 60; the processing bath 40 capable of simultaneously accommodating a plurality of wafers W, the processing bath 40 storing a process liquid into which a wafer W is immersed so as to be processed; and the transfer unit 30 that simultaneously transfers, at least to the processing bath 40 storing a process liquid, wafers W whose number is less than the number of wafers that can be simultaneously accommodated in the processing bath 40. Thus, a process using a process liquid (first chemical liquid) heated to a high temperature can be performed in the processing bath 40, and another process using a different process liquid can be performed in the processing unit 60. Thus, the number of kinds of process liquids used in the processing unit 60 can be decreased, and the overall structure of the substrate processing apparatus 10 and the control of the substrate processing apparatus 10 can be simplified, whereby a wafer W can be processed at a lower cost. Further, when a wafer W is processed in the processing bath 40 capable of accommodating a plurality of wafers W, a process liquid (first chemical liquid) can be continuously used until a processing ability of the process liquid runs out. Thus, a used amount of the process liquid (first chemical liquid) can be decreased, so that a wafer W can be processed at a lower cost. Furthermore, it is easy to maintain a temperature of the process liquid (first chemical liquid) stored in the processing bath 40 within a certain temperature range. Therefore, changes in temperature of the process liquid can be considerably restrained, to thereby restrain non-uniformity in processing of wafers so that wafers W can be uniformly processed.

The substrate processing apparatus 10 in this embodiment is not limited to the above structure, and various modifications may be made. In particular, given in the above as an example to describe the present invention is a case where the substrate processing apparatus and the substrate processing method are applied to a wafer W. However, not limited thereto, the present invention can be applied to a process for an LCD substrate, a CD substrate, and so on.

Hereinbelow, other modifications are described with reference to FIGS. 9 to 13. It is possible to combine the below-described modifications. In FIGS. 9 to 13, the same parts as those in the above embodiment are shown by the same reference numbers, and their detailed description is omitted.

(Modification 1)

In the above embodiment, although there has been shown a case in which two kinds of processes using different chemical liquids are performed to a wafer W that has been transferred to the processing part 10c in the substrate processing apparatus 10, the present invention is not limited thereto.

Figure 9:
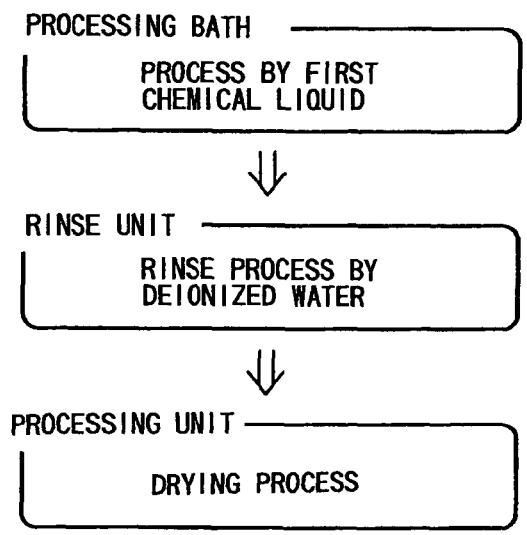
FIG. 9 is a flowchart, which corresponds to FIG. 8, for explaining a modification of the substrate processing method.

For example, as shown in FIG. 9, a process using a chemical liquid may be performed to a wafer W only once. In the example shown in FIG. 9, the step of processing a wafer W using the second chemical liquid in the processing unit 60, and the step of rinsing the wafer W by using a deionized water in the processing unit 60, are omitted from the substrate processing method in the above embodiment (see, FIG. 8).

Alternatively, a wafer W may be subjected to a process using a chemical liquid more than twice.

(Modification 2)

Figure 10:
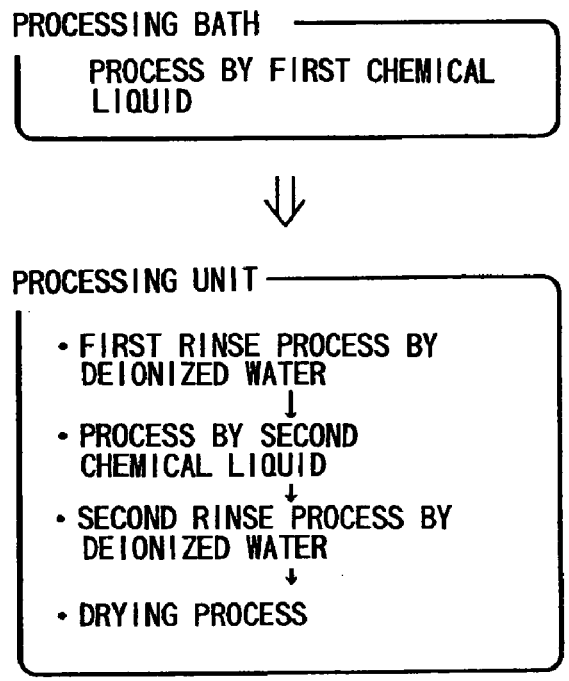
FIG. 10 is a flowchart, which corresponds to FIG. 8, for explaining another modification of the substrate processing method.

In the above embodiment, although there has been shown a case in which a wafer W is subjected to a rinse process by using the rinse unit 50, the present invention is not limited thereto. In the substrate processing method in the above embodiment, it is possible to provide a step of rinsing a wafer W by using the processing unit 60, in place of the step of rinsing a wafer W by using the rinse unit 50. Namely, as shown in FIG. 10, a wafer W, which has been subjected to a process in the processing bath 40, may be transferred from the processing bath 40 to the processing unit 60. In this case, there are performed in the processing unit 60: a step of holding one substrate W by the processing unit 60, the wafer having been processed in the processing bath 40; a step of rinsing the substrate W held by the processing unit 60 by supplying a deionized water to the substrate W; a step of processing the substrate W that is held by the processing unit 60 and has been subjected to the rinse process, by supplying a process liquid that is different from the process liquid used at the step of processing the wafer W in the processing bath 40; a step of rinsing the one substrate W that is held by the processing unit 60 and has been subjected to the process using the process liquid by the processing unit 60, by supplying a deionized water to the substrate W; and a step of drying the one substrate W that is held by the processing unit 60 and has been subjected to the rinse process by the processing unit 60.

Figure 11:
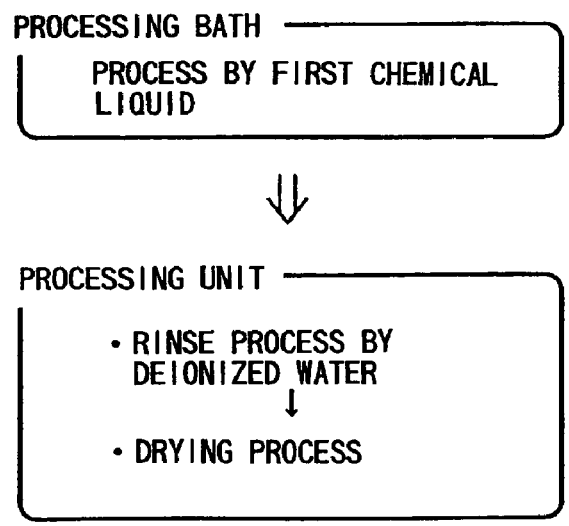
FIG. 11 is a flowchart, which corresponds to FIG. 8, for explaining still another modification of the substrate processing method.

When the process using a chemical liquid is performed only once, as shown in FIG. 11, there are performed in the processing unit 60: a step of holding one substrate W by the processing unit 60, the substrate W having been processed in the processing bath 40; a step of rinsing the substrate W held by the processing unit, by supplying a deionized water to the substrate W; and a step of drying the one substrate W that is held by the processing unit 60 and has been subjected to the rinse process by the processing unit 60.

In addition, when the step of rinsing a wafer W by using the rinse unit 50, it is possible to eliminate, from the substrate processing apparatus 10, the rinse unit 50 that rinses a wafer W by immersing the wafer W into a deionized water.

(Modification 3)

Further, in the above embodiment, although there has been shown a case in which both of the step of processing a wafer W by using the processing unit 60 and the step of processing a wafer W in the processing bath 40 are provided, the present invention is not limited thereto. For example, it is possible to process a wafer W using only the processing unit 60.

(Modification 4)

Further, there has been shown a case in which, in the rinse unit 50, the partition member 54 completely separates the accommodating parts 50*a* adjacent to each other in the rinse bath 51, so as to completely prevent flowing of a deionized water from a certain accommodating part 50*a* into another accommodating part adjacent to the certain accommodating part, the present invention is not limited thereto. The partition member 54 may be formed such that flowing of a deionized water from a certain accommodating part 50*a* to another accommodating part adjacent to the certain accommodating part can be restrained. By means of such a partition member 54, the transfer of particles as described above can be also sufficiently restrained. Such a partition member may be formed of a dummy wafer (a wafer that is not manufactured as a product or a plate member having the same shape as that of a wafer) which is supported on the wafer boat 52. Such a partition member can be formed at an extremely low cost, and the number of wafers to be accommodated in the accommodating part 50*a* can be easily changed.

(Modification 5)

Further, in the above embodiment, although there has been shown a case in which the rinse unit 50 includes the one rinse bath 50, and the rinse bath 51 is divided into the plurality of accommodating parts 50*a* by the partition member 54 disposed in the rinse bath 51, the present invention is not limited thereto. As shown in FIG. 12, a rinse unit 150 may have a plurality of accommodating parts 150*a* each of which is a rinse bath which can rinse a substrate W by immersing the substrate W into a deionized water stored therein. Namely, one accommodating part 150*a* may be formed as one bath which is discrete (independent) from other accommodating parts. In other words, the plurality of accommodating parts 150*a* may be formed as independent baths which are positioned to be spaced apart from each other. According to such a rinse unit 150, flowing of a deionized water from a certain accommodating part 150*a* into another accommodating part adjacent to the certain accommodating part can be completely prevented, to thereby securely prevent the above-described transfer of particles.

Also in the example shown in FIG. 12, the rinse unit 150 has a deionized-water supply line 156 connecting the respective rinse baths 151 (accommodating parts 150*a*) and a deionized water source 157 to each other. The deionized-water supply line 156 is connected to the respective accommodating parts 150*a* (rinse baths 150) via switching valves 156*a* whose flow rates can be controlled, respectively. Thus, an amount of deionized water per unit time to be supplied to each accommodating part 150*a* of the rinse unit 150 can be set for every accommodating part 150*a*.

(Modification 6)

In the above embodiment, although there has been shown a case in which the number of wafers W that can be simultaneously accommodated in one of the accommodating parts 50*a* of the rinse unit 50 is the same as the number of wafers W that can be simultaneously transferred by the transfer unit 30, the present invention is not limited thereto. For example, the number of wafers W that can be simultaneously accommodated in one of the accommodating parts 50*a* of the rinse unit 50 may be larger than the number of wafers W that can be simultaneously transferred by the transfer unit 30. Also in this rinse unit 50, wafers W that have been simultaneously transferred from the processing bath 40 by the transfer unit 30 can be received in the same accommodating part 50*a*. Thus, the above-described transfer of particles can be efficiently prevented.

(Modification 7)

In addition, although there has been shown a case in which two wafers W can be accommodated in each accommodating part 50*a*, and two wafers W are accommodated in each accommodating part 50*a*, the present invention is not limited thereto. For example, one wafer W may be accommodated in each accommodating part 50*a*. When one wafer W is accommodated in each accommodating part 50*a*, it is possible to securely prevent the transfer of particles between different wafers W.

When one wafer W is accommodated in each accommodating part 50*a*, wafers W may be transferred to the processing bath 40 one by one. When wafers W are transferred one by one, the transfer unit 30 may have only one fork 35*a*. In the case where the transfer unit 30 includes the only one fork 35*a* and transfers wafers W one by one, a number of wafers W can be concurrently processed in the processing bath 40, and a number of wafers W can be concurrently rinsed in the rinse unit 50. As a result, a processing ability per unit time can be improved.

(Modification 8)

Moreover, in the above embodiment, although there has been shown a case in which the movable shutters 80*a* and 80*b*, which are disposed above the upper opening 41 of the processing bath 40, are formed of the plate-like members, respectively, are capable of linearly moving along a horizontal plane above the upper opening 41 of the processing bath 40, the present invention is not limited thereto. For example, as shown in FIG. 13, there may be disposed movable shutters 180*a* and 180*b* which are capable of moving along an arcuate moving path, when viewed from the side. Each of the movable shutters 180*a* and 180*b* shown in the example of FIG. 13 has, in a side view, an arcuate contour along a moving trajectory of each of the movable shutters 180*a* and 180*b*. According to the movable shutters 180*a* and 180*b*, a space required for operating the shutters 180*a* and 180*b* can be saved. Thus, the substrate processing apparatus 10 can be made smaller.

(Modification 9)

Furthermore, in the above embodiment, although there has been shown a case in which the transfer unit 30 takes charge all the conveying operations of a wafer W in the processing part 10*a*, the present invention is not limited thereto. There may be provided two or more transfer units in accordance with the layout of the respective units 40, 50, and 60 in the processing part 10*c*.

For example, there may be separately disposed a transfer unit for loading a wafer W into the processing unit 60, and the transfer unit 30 for loading a wafer W into the processing bath 40. In addition, there may be separately disposed a transfer unit for transferring a wafer W between the processing bath 40 and the processing units 60, and the transfer unit 30 for loading a wafer W into the processing bath 40. Further, there may be separately disposed a transfer unit for transferring a wafer W between the processing bath 40 and the rinse unit 50, and the transfer unit 30 for loading a wafer W into the processing bath 40. Furthermore, there may be separately disposed a transfer unit for transferring a wafer W between the rinse unit 50 and the processing unit 60, and the transfer unit 30 for loading a wafer W into the processing bath 40.

In the above embodiment, there has been shown a case in which the respective constituent elements of the transfer unit 30 are pivotably connected with respect to each other, and the forks 35a and 35b each holding a wafer W can be moved to various positions by pivotally moving the respective constituent elements to each other. However, the present invention is not limited thereto, and another known substrate transfer unit can be employed. For example, there may be employed a transfer unit in which respective constituent elements are connected so as to be slidable with respect to each other, so that forks 35a and 35b each holding a wafer W can be moved to various positions by sliding the respective constituent elements with respect to each other.

(Modification 10)

In addition, in the above embodiment, although there has been shown a case in which a wafer W is transferred from the transit part 10b to the processing part 10 via the conveying unit 25, and a wafer W is transferred from the processing part 10c to the transit part 10b via the processing unit 60, the present invention is not limited thereto. For example, a countermeasure may be taken to prevent adhesion of a liquid to a dried wafer W, and all the conveying operations of a wafer W between the transit part 10b and the processing part 10c may be performed via the conveying unit 25. As an example for the countermeasure against adhesion of a liquid to a dried wafer W, there may be disposed a transfer unit, separately from the transfer unit 30, for transferring a wafer W from the processing unit 60 to the conveying unit 25, or there may be disposed a unit for cleaning and drying the forks 35a and 35b of the transfer unit 30.

(Modification 11)

Moreover, in the above embodiment, although there has been shown a case in which all the process liquid collected in the cup of the processing unit 60 is discarded, the present invention is not limited thereto, and the process liquid may be recycled.

What is claimed is:

1. A substrate processing apparatus comprising:
   a processing unit having a holding mechanism configured to hold one substrate and a nozzle configured to supply a process liquid and process the substrate held by the holding mechanism;
   a processing bath capable of simultaneously accommodating a plurality of substrates, the processing bath storing a process liquid into which a substrate is immersed so as to be processed;
   an outer bath disposed on the processing bath and configured to collect a process liquid overflown from the processing bath;
   a circulation line disposed between the processing bath and outer bath so as to allow the process liquid overflown into the outer bath to return to the processing bath; and
   a transfer unit having a rotatable support arm and at least two holding parts supported by the support arm, the at least two holding parts being operable independently from each other with respect to the support arm, each holding part being able to hold one substrate,
   wherein the transfer unit is configured to simultaneously transfer vertically, by means of the at least two holding parts, into the processing bath one or more substrates whose number is less than the number of substrates that can be simultaneously accommodated in the processing bath, and are configured to transfer horizontally one substrate, by means of one of the at least two holding parts, into the processing unit, and
   wherein the substrate processing apparatus is configured to process one or more substrates with the use of at least one of the processing units and the processing bath.

2. The substrate processing apparatus according to claim 1, further comprising a control device configured to regulate a substrate processing period in the processing bath, for every one or more substrates that have been simultaneously transferred by the transfer unit to the processing bath.

3. The substrate processing apparatus according to claim 2, wherein
   the control device is configured to measure an elapsed substrate processing period of every one or more substrates that have been simultaneously transferred by the transfer unit to the processing bath, and control the transfer unit in such a manner that, when the elapsed substrate processing period reaches a preset processing period, the one or more substrates are held and drawn up from the processing bath.

4. The substrate processing apparatus according to claim 1, wherein
   the transfer unit is configured to receive a substrate that have been processed in the processing bath, and to transfer the substrate to the processing unit.

5. The substrate processing apparatus according to claim 1, further comprising a rinse unit configured to rinse a substrate, which has been processed in at least one of the processing units and the processing bath and then transferred to the rinse unit by the transfer unit, by immersing the substrate into a water stored therein,
   wherein the rinse unit includes a plurality of accommodating parts each of which is capable of simultaneously accommodating one or more substrates whose number is less than the number of substrates that can be simultaneously accommodated in the processing bath.

6. The substrate processing apparatus according to claim 5, wherein
   the plurality of accommodating parts are formed as separate baths that are spaced apart from each other.

7. The substrate processing apparatus according to claim 5, wherein
   the rinse unit includes a bath having therein a partition member, and an inside of the bath is divided into the plurality of accommodating parts by the partition member.

8. The substrate processing apparatus according to claim 5, further comprising a control device connected to the rinse unit,
   wherein the rinse unit further includes a valve disposed on a water supply line connected to the bath, and
   wherein the control device is configured to set, for each of the accommodating parts, an amount of water per unit time to be replenished into each of the accommodating parts of the rinse unit through the water supply line, by controlling the valve.

9. The substrate processing apparatus according to claim 5, wherein the transfer unit is configured to transfer one or more substrates that has been processed in the processing bath to the rinse unit, and to further transfer the substrate that has been rinsed in the rinse unit to the processing unit.

10. The substrate processing apparatus according to claim 9, wherein the number of the substrates that can be simultaneously accommodated in one of the accommodating parts is not less than the number of the substrates that can be simultaneously transferred by the transfer unit.

11. The substrate processing apparatus according to claim 1, further comprising:

a movable shutter disposed above an upper opening of the processing bath;

a driving mechanism configured to move the movable shutter; and a control device connected to the driving mechanism so as to control a position of the movable shutter relative to the processing bath;

wherein the control device is configured to control the movable shutter, in order to convey a substrate between the transfer unit and the processing bath, in such a manner that a part that is above a position on which the substrate is to be placed in the processing bath is opened.

12. The substrate processing apparatus according to claim 11, wherein the movable shutter includes two plate-like members that are capable of moving above the upper opening of the processing bath, the driving mechanism includes two driving devices, and the control device is configured to control, by means of the two driving devices, the movable shutter in such a manner that the two plate-like members are separated from each other to form a gap therebetween, so that the part that is above the position on which the substrate is to be placed in the processing bath is opened by the gap between the two plate-like members.

13. The substrate processing apparatus according to claim 12, wherein the control device is configured to control, by means of the two driving devices, the movable shutter in such a manner that relative positions of the two plate-like members are changed, so that a size of the gap is changed in accordance with the number of substrates to be simultaneously conveyed.

14. The substrate processing apparatus according to claim 11, wherein a baffle plate projecting from the movable shutter is provided so as to be located near the position on which the substrate is to be placed in the processing bath upper.

* * * * *